United States Patent
Kim

(10) Patent No.: US 11,356,124 B2
(45) Date of Patent: Jun. 7, 2022

(54) ELECTRONIC DEVICE

(71) Applicant: SK hynix Inc., Icheon-si (KR)

(72) Inventor: Jang Seob Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/017,331

(22) Filed: Sep. 10, 2020

(65) Prior Publication Data

US 2021/0314004 A1 Oct. 7, 2021

(30) Foreign Application Priority Data

Apr. 3, 2020 (KR) .................... 10-2020-0040627

(51) Int. Cl.
*H03M 13/45* (2006.01)
*H03M 13/11* (2006.01)
*G06N 3/04* (2006.01)
*G06N 3/08* (2006.01)
*H03M 13/00* (2006.01)

(52) U.S. Cl.
CPC ............ *H03M 13/458* (2013.01); *G06N 3/04* (2013.01); *G06N 3/08* (2013.01); *H03M 13/116* (2013.01); *H03M 13/616* (2013.01)

(58) Field of Classification Search
CPC ............ H03M 13/458; H03M 13/116; H03M 13/616; G06N 3/04; G06N 3/08
See application file for complete search history.

(56) References Cited

U.S. PATENT DOCUMENTS

| | | | | |
|---|---|---|---|---|
| 2019/0147360 A1* | 5/2019 | Matsumoto | ............ | G06Q 30/06 709/203 |
| 2019/0147361 A1* | 5/2019 | Matsumoto | ............ | G06N 20/20 706/12 |
| 2020/0213343 A1* | 7/2020 | Bharrat | ............ | G06Q 10/06393 |
| 2021/0110241 A1* | 4/2021 | Tullberg | ............ | H03M 13/1191 |
| 2021/0142158 A1* | 5/2021 | Agrawal | ............ | H03M 13/1191 |

OTHER PUBLICATIONS

Nachmani, E. et al., "Learning to Decode Linear Codes Using Deep Learning," IEEE, Sep. 30, 2016, 6 pages.
Nakamura, T. et al., "Artifical Neural Network Coupled LDPC ECC for 3D-NAND Flash Memories," Chuo University, Japan, 2018, 29 pages.

* cited by examiner

*Primary Examiner* — Thien Nguyen
(74) *Attorney, Agent, or Firm* — Perkins Coie LLP

(57) ABSTRACT

Provided herein may be an electronic device using an artificial neural network. The electronic device may include a training data generator configured to determine an input vector corresponding to a trapping set, detected during error correction decoding corresponding to a codeword, and a target vector corresponding to the input vector, and a training component configured to train an artificial neural network based on supervised learning by inputting the input vector to an input layer of the artificial neural network and by inputting the target vector to an output layer of the artificial neural network.

13 Claims, 21 Drawing Sheets

FIG. 7

$$\begin{pmatrix} \{1\,0\,1\,0\,1\,0\,1\,0\} \\ \{0\,1\,0\,1\,0\,1\,0\,1\} \\ \vdots \\ \{1\,1\,0\,0\,1\,1\,0\,0\} \end{pmatrix} + \{1\,0\,0\,1\,0\,0\,0\,0\} = \begin{pmatrix} \{0\,0\,1\,1\,1\,0\,1\,0\} \\ \{1\,1\,0\,0\,0\,1\,0\,1\} \\ \vdots \\ \{0\,1\,0\,1\,1\,1\,0\,0\} \end{pmatrix}$$

Null space     Error vector     Input vectors $$\begin{pmatrix} \{1\,0\,1\,0\,1\,0\,1\,0\} \\ \{0\,1\,0\,1\,0\,1\,0\,1\} \\ \vdots \\ \{1\,1\,0\,0\,1\,1\,0\,0\} \end{pmatrix}$$

Target vectors
= Null space

FIG. 13

$$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

FIG. 15

$$\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix} \times \begin{bmatrix} C_{i1} \\ C_{i2} \\ C_{i3} \\ \vdots \\ C_{i7} \end{bmatrix} = \begin{bmatrix} S_{i1} \\ S_{i2} \\ S_{i3} \end{bmatrix}$$

$$H \qquad\qquad C_i^T \qquad\quad S_i$$

FIG. 18

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | -4 | +4 | | | | | | |
| 3 | -4 | -2 | +4 | | | | | |
| 4 | -4 | -2 | +2 | +4 | | | | |
| 5 | -4 | -3 | -2 | +2 | +4 | | | |
| 6 | -4 | -3 | -2 | -1 | +2 | +4 | | |
| 7 | -4 | -3 | -2 | -1 | +1 | +2 | +4 | |
| 8 | -4 | -3 | -2 | -1 | +1 | +2 | +3 | +4 | ns
ELECTRONIC DEVICE

CROSS-REFERENCE TO RELATED APPLICATION

This patent document claims priority to and benefits of the Korean patent application number 10-2020-0040627, filed on Apr. 3, 2020, which is incorporated herein by reference in its entirety.

TECHNICAL FIELD

Various embodiments of the disclosed technology relate to an electronic device, for example, to an electronic device using an artificial neural network.

BACKGROUND

An electronic device may include a storage medium which temporarily or permanently stores data. During various operations such as write, read, transmission or processing operations, data error or data corruption may occur.

In order to guarantee the reliability of data, an electronic device may use error correction techniques, such as error correction encoding and error correction decoding.

SUMMARY

Various embodiments of the disclosed technology are directed to an electronic device, which trains an artificial neural network used to mitigate an error floor phenomenon.

Various embodiments of the disclosed technology are directed to an electronic device, which mitigates an error floor phenomenon using a trained artificial neural network.

An embodiment of the disclosed technology may provide for an electronic device. The electronic device may include a training data generator configured to generate an input vector based on information of a trapping set that is detected during an error correction decoding corresponding to a codeword, and to generate a target vector corresponding to the input vector, and a training component configured to receive from the training data generator the input vector and the target vector and operable to train an artificial neural network based on supervised learning by inputting the input vector to an input layer of the artificial neural network and by inputting the target vector to an output layer of the artificial neural network.

An embodiment of the disclosed technology may provide for an electronic device. The electronic device may include a node processor configured to perform an i-th iteration within a maximum number of iterations I based on an iterative decoding scheme, and generate an intermediate result corresponding to the i-th iteration, where i and I are natural numbers and i is less than or equal to I, and a post processor in communication with the node processor and configured to, in response to a detection of a trapping set in the i-th iteration, provide to a trained artificial neural network, an input that includes at least a part of the intermediate result from the node processor corresponding to the i-th iteration to a trained artificial neural network, and operable to modify a variable node vector corresponding to the i-th iteration based on predicted values of the trained artificial neural network corresponding to the input, wherein the intermediate result corresponding to the i-th iteration includes at least one of an a-posteriori probability vector, a hard-decision vector, or a syndrome vector associated with the trapping set detected in the i-th iteration.

BRIEF DESCRIPTION OF THE DRAWINGS

FIG. 7 is an example diagram illustrating a training data generation method according to an embodiment of the present disclosure.

FIG. 13 is an example diagram illustrating a parity check matrix.

FIG. 15 is an example diagram illustrating a syndrome vector calculated using the parity check matrix of FIG. 13.

FIG. 18 is an example diagram illustrating a lookup table.

DETAILED DESCRIPTION

Specific structural or functional descriptions in the embodiments of the disclosed technology introduced in this specification or application are exemplified to describe embodiments of the disclosed technology. The disclosed technology may be practiced in various forms, and should not be construed as being limited to the embodiments and examples described in this patent document.

Figure 1:
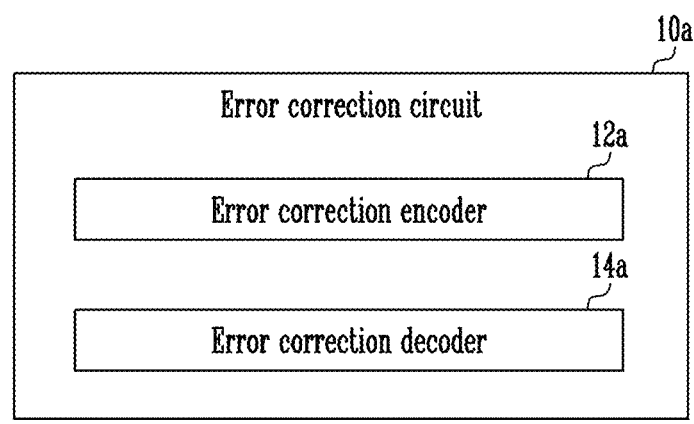
FIG. 1 is an example diagram illustrating an error correction circuit.

FIG. 1 is an example diagram illustrating an error correction circuit.

Referring to FIG. 1, an error correction circuit 10a may include an error correction encoder 12a and an error correction decoder 14a.

The error correction encoder 12a may generate an n-bit codeword (where n is a natural number) by performing error correction encoding using k-bit original data (where k is a natural number) and a generator matrix for an error correction code (ECC). The error correction encoder 12a may output the generated codeword to a channel.

The error correction decoder 14a may receive an n-bit vector corresponding to the codeword from the channel. The received vector may be a vector in which an error is contained in the codeword. The error correction decoder 14a may perform error correction decoding using the received vector and a parity check matrix of the error correction code. When a valid codeword that satisfies constraints for the parity check matrix of the error correction code is generated, the error correction decoder 14a may output the generated valid codeword as a decoded codeword. The error correction decoder 14a may output a fail signal indicating that error correction decoding has failed when a valid codeword satisfying the constraints for the parity check matrix is not generated.

Figure 2:
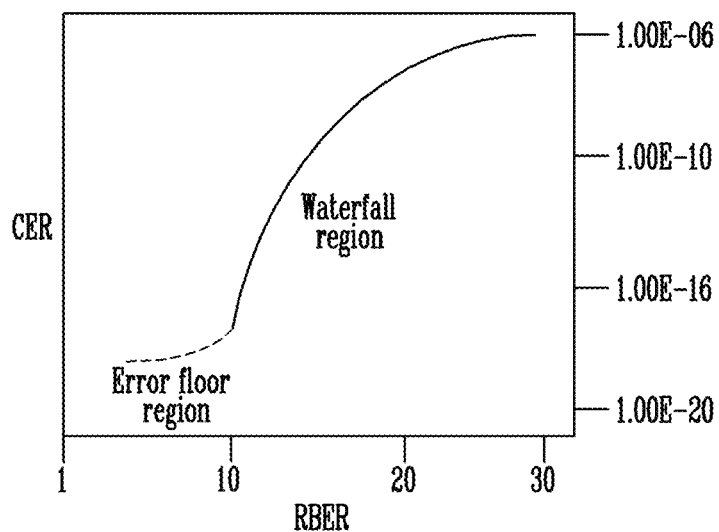
FIG. 2 is an example diagram illustrating an error floor.

FIG. 2 is an example diagram illustrating an error floor.

When the performance of graph-based error correction codes, for example, low density parity check (LDPC) codes or turbo codes, is evaluated, a phenomenon called an error floor may occur.

For example, as illustrated in FIG. 2, in a performance graph for graph-based error correction codes, a waterfall region, in which a chunk bit error rate (CBER) sharply decreases in the form of a curve as a raw bit error rate (RBER) decreases, and an error floor region, in which the curve is suddenly flattened in a portion below a specific RBER, may appear. Here, the term "RBER" refers to the number of errors contained in the received vector, and the term "CBER" refers to the probability that error correction decoding will fail.

An error floor acts as a factor which degrades error correction performance at a low error level, and it is known to be generally caused by a trapping set, in particular, an absorbing set. In particular, as irregularity in the parity check matrix increases, a proportion of the trapping set increases, with the result that the problem of an error floor phenomenon being intensified may occur.

Embodiments of the disclosed technology provide a scheme which uses an artificial neural network (ANN) so as to mitigate an error floor phenomenon caused by such a trapping set. Embodiments of the disclosed technology provide a scheme which trains an artificial neural network using training data corresponding to a trapping set, and a scheme which breaks a detected trapping set using a trained artificial neural network during error correction decoding.

Figure 3:
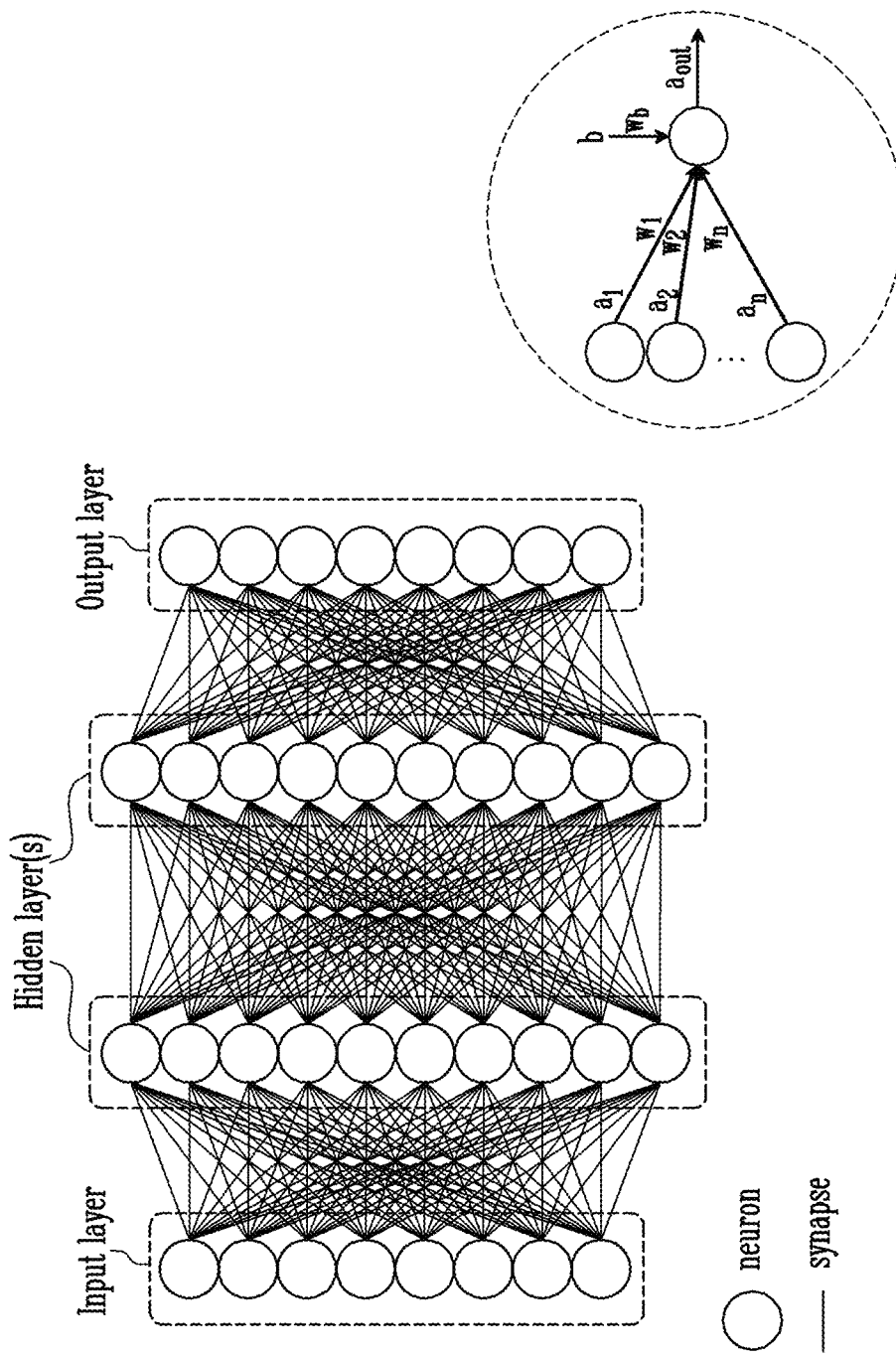
FIG. 3 is an example diagram illustrating an artificial neural network.

FIG. 3 is an example diagram illustrating an artificial neural network.

An artificial neural network may include an input layer, at least one hidden layer, and an output layer. Each of the input layer, the hidden layer, and the output layer may include a plurality of signal processing elements or nodes effectuating artificial neurons or neurons. A neuron present in the input layer may be referred to as an input neuron, a neuron present in the one or more hidden layers may be referred to as a hidden neuron, and a neuron present in the output layer may be referred to an output neuron. Certain signal processing elements or nodes are connected via connecting junctions as artificial synapses. Each connecting junction connecting two nodes or neurons (e.g., two nodes in different adjacent layers) can be structured to receive and process a signal from a first signal processing element or neuron to produce a junction signal that is received by a second signal processing element or neuron. As shown in FIG. 1, connecting junctions or synapses provide connections between signal processing elements or neurons in different layers such as adjacent layers, such as neurons of the input layer and neurons of the first hidden layer, neurons of different hidden layers and neurons of the last hidden layer and the neurons of the output layer. As illustrated in FIG. 1, one neuron on a layer may be connected by synapses to different neurons in another adjacent layer and, in various implementations, the output of one neuron may be weighted differently by synapses to other neurons in an adjacent layer.

The artificial neural network may be trained depending on a supervised learning scheme or an unsupervised learning scheme.

When the supervised learning scheme is used during training, an input vector may be input to the input layer, and a target vector may be input to the output layer. A pair of one input vector and one target vector may be referred to as one piece of training data. The input vector may include a number of pieces of data identical to the number of input neurons, and the pieces of data included in the input vector may be input to the input neurons, e.g., one by one. Similarly, the target vector may include a number of pieces of data identical to the number of output neurons, and the pieces of data included in the target vector may be input to the output neurons, e.g., one by one.

While training is performed, at least one forward propagation and at least one back propagation may be performed on the artificial neural network.

For example, during forward propagation, each of the neurons may calculate its output value $a_{out}$ depending on an activation function. For example, the output value $a_{out}$ may be calculated using the following Equation (1):

$$a_{out} = g(z), \text{ where } z = bw_b + \sum_{i=1}^{N} a_i w_i \qquad (1)$$

where, g(z) denotes an activation function of the neuron, b denotes a bias value of the neuron, $w_b$ denotes a bias weight value of the neuron, $a_i$ denotes an output value received from an i-th neuron (where i is a natural number), among neurons included in a previous layer, and $w_i$ denotes a weight value of a synapse coupled to the i-th neuron, among the neurons included in the previous layer. In accordance with an embodiment, when the output value $a_{out}$ is calculated, the bias value b and the bias weight value $w_b$, may not be used.

When forward propagation to the output neurons is performed, back propagation may be performed so as to reduce an error value between a predicted vector output values calculated by the output neurons) and a target vector. During back propagation, model parameters, for example, the bias weight values $w_b$ of respective neurons and the weight values $w_1, w_2, \ldots, w_n$ of synapses may be updated. For example, during back propagation, the gradient of loss may be calculated based on gradient descent, and the best combination of model parameters may be found so as to minimize the loss.

Figure 4:
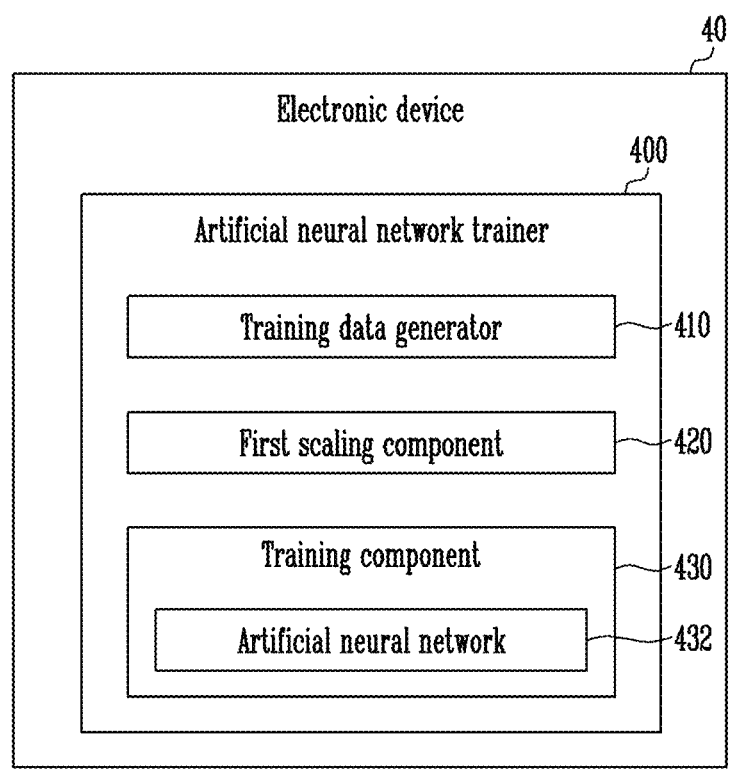
FIG. 4 is an example diagram illustrating an electronic device according to an embodiment of the disclosed technology.

FIG. 4 is an example diagram illustrating an electronic device according to an embodiment of the disclosed technology.

An electronic device 40 may be a device which calculates or processes information having an electronic form using an electronic circuit, and may include a computer, a memory controller, an error correction circuit or an error correction decoder.

The electronic device 40 may include an artificial neural network trainer 400.

The artificial neural network trainer 400 may include a training data generator 410, a first scaling component 420, and a training component 430.

The training data generator 410 may generate at least one piece of training data used to train an artificial neural network 432. The one piece of training data may include one input vector and one target vector.

Hereinafter, an input vector that is input to the input layer of the artificial neural network 432 during the training of the artificial neural network is referred to as a first input vector, and an input vector that is input to the input layer of the trained artificial neural network during prediction using the trained artificial neural network is referred to as a second input vector.

The training data generator 410 may generate training data based on trapping set information received from an external device. The trapping set information may include at least one of a hard-decision vector corresponding to the trapping set, an a-posteriori probability vector (APP) vector corresponding to the trapping set, error indices corresponding to the trapping set, an error vector corresponding to the trapping set, a syndrome vector corresponding to the trapping set, and a codeword.

The trapping set information may be known information. For example, the trapping set information may be information acquired through test error correction decoding that is previously performed to detect a trapping set.

When an (n, k) code is used, each of a codeword, a hard-decision vector corresponding to the trapping set, and an error vector corresponding to the trapping set may be composed of n binary values. An a-posteriori probability vector corresponding to the trapping set may be composed of n log likelihood ratio (LLR) values. A syndrome vector corresponding to the trapping set may be composed of n-k binary values.

In an embodiment, when a codeword and a hard-decision vector corresponding to the trapping set are included in the trapping set information, the training data generator 410 may determine the hard-decision vector corresponding to the trapping set to be the first input vector, and may determine the codeword to be the target vector. The hard-decision vector corresponding to the trapping set may be, for example, a hard-decision vector in which the trapping set is estimated to be present during test error correction decoding that is performed in accordance with the codeword using an iterative decoding scheme.

In an embodiment, when the codeword and the hard-decision vector corresponding to the trapping set are included in the trapping set information, the training data generator 410 may determine a partial hard-decision vector composed of some binary values, among binary values included in the hard-decision vector corresponding to the trapping set, to be the first input vector. The training data generator 410 may determine a partial codeword composed of binary values corresponding to the partial hard-decision vector, among binary values included in the codeword, to be the target vector.

In an embodiment, when a hard-decision vector corresponding to the trapping set and error indices corresponding to the trapping set are included in the trapping set information, the training data generator 410 may determine the hard-decision vector corresponding to the trapping set to be the first input vector. The error indices corresponding to the trapping set may be information indicating the positions of errors contained in the hard-decision vector corresponding to the trapping set. The training data generator 410 may reconstruct the codeword by flipping binary values corresponding to the error indices, among binary values included in the hard-decision vector corresponding to the trapping set, and may determine the reconstructed codeword to be the target vector.

In an embodiment, when a hard-decision vector corresponding to the trapping set and error indices corresponding to the trapping set are included in the trapping set information, the training data generator 410 may determine a partial hard-decision vector composed of or including some binary values, among binary values included in the hard-decision vector corresponding to the trapping set, to be the first input vector. The training data generator 410 may reconstruct the codeword by flipping binary values corresponding to the error indices, among the binary values included in the hard-decision vector corresponding to the trapping set. The training data generator 410 may determine a partial codeword composed of binary values corresponding to the partial hard-decision vector, among binary values included in the reconstructed codeword, to be the target vector.

In an embodiment, when an a-posteriori probability vector corresponding to the trapping set and error indices corresponding to the trapping set are included in the trapping set information, the training data generator 410 may determine the a-posteriori probability vector, corresponding to the trapping set, to be the first input vector. The a-posteriori probability vector corresponding to the trapping set may be, for example, an APP vector in which the trapping set is estimated to be present during test error correction decoding that is performed in accordance with the codeword using an iterative decoding scheme. The training data generator 410 may correct at least one of the magnitudes or the signs of LLR values corresponding to the error indices, among LLR values included in the a-posteriori probability vector corresponding to the trapping set, and may determine the corrected a-posteriori probability vector to be the target vector.

In an embodiment, when an a-posteriori probability vector corresponding to the trapping set and error indices corresponding to the trapping set are included in the trapping set information, the training data generator 410 may determine a partial a-posteriori probability vector composed of some LLR values, among LLR values included in the a-posteriori probability vector corresponding to the trapping set, to be the first input vector. The training data generator 410 may correct at least one of magnitudes or signs of LLR values corresponding to the error indices, among LLR values included in the a-posteriori probability vector corresponding to the trapping set, and may then generate the corrected a-posteriori probability vector. The training data generator 410 may determine a corrected partial a-posteriori probability vector composed of LLR values corresponding to the partial a-posteriori probability vector, among the LLR values included in the corrected a-posteriori probability vector, to be the target vector.

In an embodiment, when an error vector corresponding to the trapping set is included in the trapping set information, the training data generator 410 may determine the error vector, a partial error vector, a partially cyclic-shifted error vector or a partially cyclic-shifted partial error vector to be the first input vector. The training data generator 410 may determine a zero vector, corresponding to the first input vector, to be the target vector.

The error vector may be a vector having the same length as the codeword, and may be, for example, a vector in which binary values corresponding to the positions of errors corresponding to the trapping set are set to '1' and the remaining binary values are set to '0'. The zero vector may be a vector in which all binary values are '0'.

For example, the training data generator 410 may determine an error vector composed of or including n binary values to be the first input vector. In some implementations, the training data generator 410 may determine a zero vector composed of n binary values to be the target vector.

For example, the training data generator 410 may generate a partially cyclic-shifted error vector by partially cyclic-shifting the n binary values included in the error vector, and may determine the generated partially cyclic-shifted error vector to be the first input vector. In some implementations, the training data generator 410 may determine a zero vector composed of n binary values to be the target vector.

For example, the training data generator 410 may select j binary values (where j is a natural number less than n) among the n binary values included in the error vector, and may determine a partial error vector composed of the selected j binary values to be the first input vector. In some implementations, the training data generator 410 may determine a zero vector composed of j binary values to be the target vector.

For example, the training data generator 410 may generate a partially cyclic-shifted partial error vector by partially cyclic-shifting the j binary values included in the partial error vector, and may determine the generated partially cyclic-shifted partial error vector to be the first input vector. In some implementations, the training data generator 410 may determine a zero vector composed of j binary values to be the target vector.

In an embodiment, when a syndrome vector corresponding to the trapping set and an error vector corresponding to the trapping set are included in the trapping set information, the training data generator 410 may determine the syndrome vector to be the first input vector, and may determine the error vector to be the target vector. The syndrome vector corresponding to the trapping set may be, for example, a syndrome vector generated by performing an operation on the hard-decision vector, in which the trapping set is estimated to be present during test error correction decoding that is performed using an iterative decoding scheme, and a parity check matrix.

In an embodiment, when an error vector is included in the trapping set information, the training data generator 410 may generate vectors containing error by adding the error vector to each of codewords included in a null space, and may determine each of the generated vectors containing error to the first input vector. Here, the training data generator 410 may determine each codeword to be the target vector. The codewords included in the null space may be received from an external device, with the codewords being included in the trapping set information, or alternatively, the artificial neural network trainer 400 itself may include the codewords therein.

The first scaling component 420 may scale the training data received from the training data generator 410, and may provide the scaled training data to the training component 430.

In an embodiment, when the training data is composed of binary values, the first scaling component 420 may scale the training data so that the binary values included in the training data are values falling within a preset range. For example, the first scaling component 420 may scale the binary values included in the training data based on the following Equation (2):

$$x' = \frac{1-2x}{2} \quad (2)$$

In Equation (2), x denotes a binary value included in the training data, and x' denotes a scaled binary value. According to Equation (2), among the binary values included in the training data, '0' may be scaled to 0.5, and '1' may be scaled to −0.5.

In an embodiment, when the training data is composed of LLR values, the first scaling component 420 may scale the training data so that the LLR values included in the training data are values falling within a preset range. For example, the first scaling component 420 may scale the LLR values included in the training data based on the following Equation (3):

$$x' = \frac{x - \text{minLLR}}{\text{maxLLR} - \text{minLLR}} + \beta \quad (3)$$

In Equation (3), x denotes an LLR value included in the training data, minLLR denotes a minimum LLR value, maxLLR denotes a maximum LLR value, β denotes a scaling offset value, and x' denotes a scaled LLR value. In Equation (3), assuming that the scaling offset value β is −0.5, each of the LLR values included in the training data may be scaled to a value that is equal to or greater than −0.5 and less than or equal to 0.5.

When the values included in the training data are scaled to values falling within the preset range, overfitting may be prevented.

In accordance with an embodiment, scaling may not be performed, and in this case, the first scaling component 420 may be omitted. Hereinafter, the term "training data" may mean scaled training data or unscaled training data.

The training component 430 may train at least one artificial neural network 432 depending on a supervised learning scheme using the training data received from the training data generator 410 or the first scaling component 420. For example, the training component 430 may train the artificial neural network 432 by inputting the first input vector included in the training data to the input layer of the artificial neural network 432 and by inputting the target vector included in the training data to the output layer of the artificial neural network 432.

Some of hyper parameters required to train the artificial neural network 432, for example, at least one of the number of hidden layers, the number of hidden neurons, or a learning rate, may be arbitrarily or experimentally determined.

In an embodiment, the number of input neurons and the number of output neurons, among the hyper-parameters required to train the artificial neural network 432, may be determined depending on the lengths of the first input vector and the target vector.

For example, when a first input vector composed of n binary values and a target vector composed of n binary values are used, or when a first input vector composed of n LLR values and a target vector composed of n LLR values are used, the number of input neurons and the number of output neurons may each be determined to be n. That is, when the first input vector having a length of n and the target vector having a length of n are used, a first artificial neural network including n input neurons and n output neurons may be trained.

For example, when a first input vector composed of j binary values (where j is a natural number less than n) and a target vector composed of j binary values are used, or when a first input vector composed of j LLR values and a target vector composed of j LLR values are used, the number of input neurons and the number of output neurons may each be determined to be j. That is, when the first input vector having a length of j and the target vector having a length of j are used, a second artificial neural network including j input neurons and j output neurons may be trained.

For example, when a first input vector composed of n–k binary values and a target vector composed of n binary values are used, the number of input neurons may be determined to be n–k, and the number of output neurons may be determined to be n. That is, when the first input vector having a length of n–k and the target vector having a length of n are used, a third artificial neural network including n–k input neurons and n output neurons may be trained.

In an embodiment, each of the number of input neurons and the number of output neurons, among the hyper-parameters required in order to train the artificial neural network 432, may be fixed at, for example, n.

For example, when a first artificial neural network including n input neurons and n output neurons is trained, a first input vector having a length of n and a target vector having a length of n may be used or, alternatively, a first input vector having a length of j and a target vector having a length of j may be used. Alternatively, a first input vector having a length of n–k and a target vector having a length of n may be used. Here, when a first input vector or a target vector having a length of less than n or is used, a preset value (e.g., 0) may be input to some of n input neurons or n output neurons. For example, when a first input vector composed of j binary values is used, the first input vector may be input to j input neurons, among the n input neurons, and a preset value (e.g., 0) may be input to n-j input neurons, among the n input neurons.

In an embodiment, the training data composed of binary values and the training data composed of LLR values may be used to train the same artificial neural network or train different artificial neural networks. For example, the training data composed of binary values and the training data composed of LLR values may be used to train the first artificial neural network. For example, the training data composed of binary values may be used to train the first artificial neural network, and the training data composed of LLR values may be used to train an artificial neural network other than the first artificial neural network.

Figure 5:
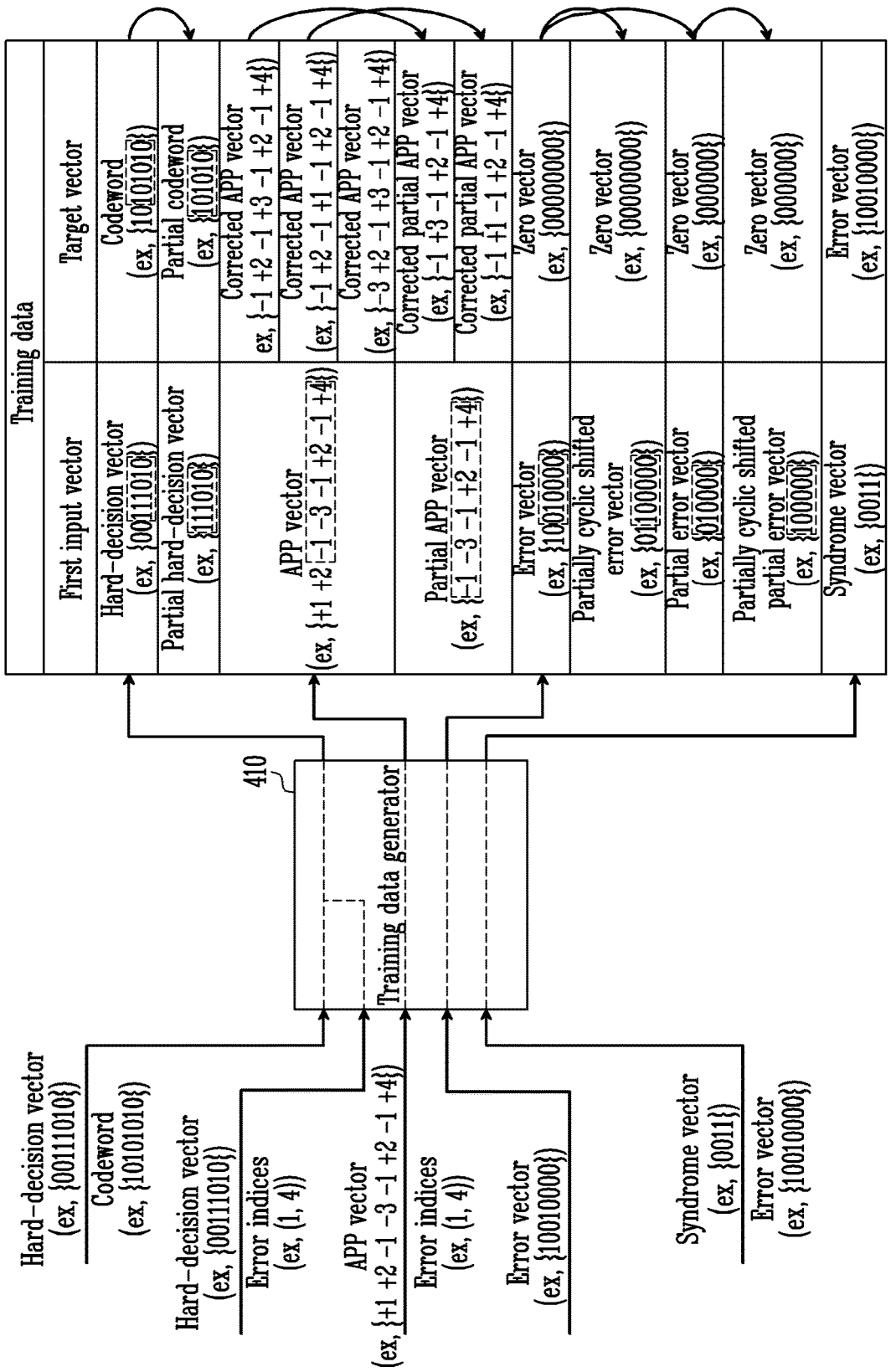
FIG. 5 is a diagram illustrating training data according to an embodiment of the disclosed technology.

FIG. 5 is a diagram illustrating training data according to an embodiment of the disclosed technology.

It is assumed that at least one of a codeword {10101010}, a hard-decision vector {00111010} corresponding to a trapping set detected during test error correction decoding corresponding to the codeword {10101010}, error indices (1, 4) indicating the positions of errors corresponding to the trapping set, an a-posteriori probability vector {+1 +2 –1 –3 –1 +2 –1 +4} corresponding to the trapping set, an error vector {10010000} corresponding to the trapping set, or a syndrome vector {0011} corresponding to the trapping set is known.

As described above with reference to FIG. 4, the training data generator 410 may determine a first input vector and a target vector using various methods.

For example, the training data generator 410 may determine the hard-decision vector {00111010} to be the first input vector, and may determine the codeword {10101010} to be the target vector.

For example, the training data generator 410 may determine a partial hard-decision vector {111010} composed of j binary values, among binary values included in the hard-decision vector {00111010}, to be the first input vector, and may determine a partial codeword {101010} composed of binary values corresponding to the first input vector, among the binary values included in the codeword {10101010}, to be the target vector.

For example, the training data generator 410 may determine the a-posteriori probability (APP) vector {+1 +2 –1 –3 –1 +2 –1 +4} to be the first input vector, and may determine any one of corrected APP vectors {–1 +2 –1 +3 –1 +2 –1 +4}, {–1 +2 –1 +1 –1 +2 –1 +4} and {–3 +2 –1 +3 –1 +2 –1 +4}, which are generated by correcting at least one of the magnitudes or signs of LLR values corresponding to the error indices (1, 4), among the LLR values included in the a-posteriori probability (APP) vector {+1 +2 –1 –3 –1 +2 –1 +4}, to be the target vector.

For example, the training data generator 410 may determine a partial APP vector {–1 –3 –1 +2 –1 +4} composed of j LLR values, among LLR values included in the APP vector {+1 +2 –1 –3 –1 +2 –1 +4}, to be the first input vector, and may determine any one of corrected partial APP vectors {–1 +3 –1 +2 –1 +4} and {–1 +1 –1 +2 –1 +4}, which are composed of LLR values corresponding to the partial APP vector {–1 –3 –1 +2 –1 +4}, among the LLR values included in the corrected APP vector {–1 +2 –1 +3 –1 +2 –1 +4}, {–1 +2 –1 +1 –1 +2 –1 +4}, or {–3 +2 –1 +3 –1 +2 –1 +4}, to be the target vector.

For example, the training data generator 410 may determine the error vector {10010000} to be the first input vector, and may determine the zero vector {00000000} to be the target vector.

For example, the training data generator 410 may determine a partially cyclic-shifted error vector {01100000}, which is generated by partially cyclic-shifting the binary values included in the error vector {10010000}, to be the first input vector, and may determine the zero vector {00000000} to be the target vector. In FIG. 5, an example in which binary values included in the error vector are cyclic-shifted in units of two binary values is illustrated.

For example, the training data generator 410 may determine a partial error vector {010000} composed of j binary values, among binary values included in the error vector {10010000}, to be the first input vector, and may determine the zero vector {000000} to be the target vector.

For example, the training data generator 410 may determine a partially cyclic-shifted partial error vector {100000}, which is generated by partially cyclic-shifting the binary values included in the partial error vector {010000}, to be the first input vector, and may determine the zero vector {000000} to be the target vector.

For example, the training data generator 410 may determine the syndrome vector {0011} to be the first input vector, and may determine the error vector {10010000} to be the target vector.

Figure 6:
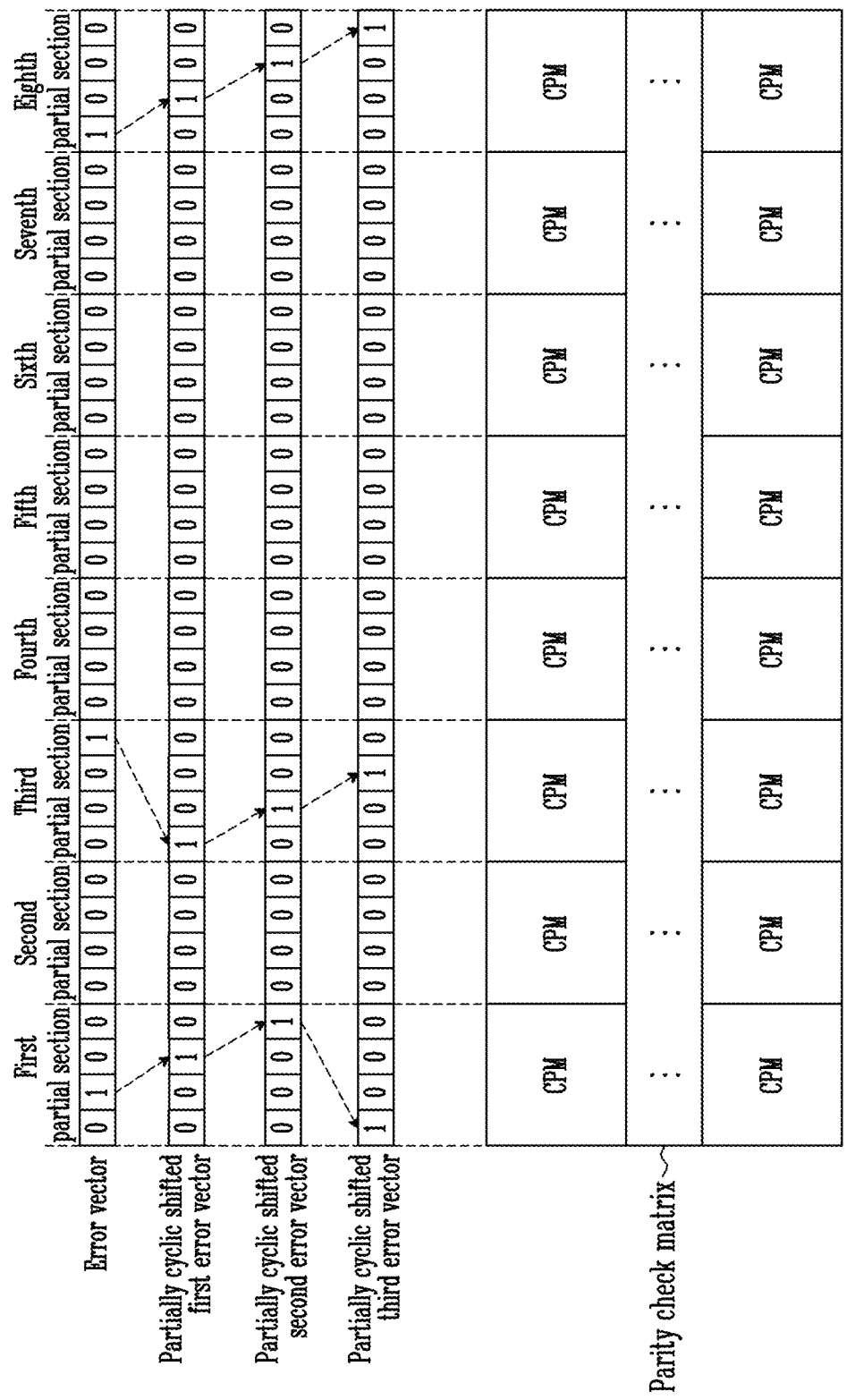
FIG. 6 is an example diagram illustrating a training data generation method according to an embodiment of the disclosed technology.

FIG. 6 is an example diagram illustrating a training data generation method according to an embodiment of the disclosed technology.

As described above, the training data generator 410 may generate a first input vector by partially cyclic-shifting binary values included in an error vector or a partial error vector.

For example, when a quasi cyclic (QC)-LDPC code is used as an error correction code, the training data generator 410 may generate a partially cyclic-shifted error vector or a partially cyclic-shifted partial error vector by dividing an error vector or a partial error vector into a plurality of partial sections, corresponding to cyclic permutation matrices (CPM) included in a parity check matrix of the QC-LDPC code, and by cyclic-shifting vectors respectively included in the plurality of partial sections.

In FIG. 6, an example in which, when the size of cyclic permutation matrices included in the parity check matrix of the QC-LDPC code is 4×4, binary values included in the error vector are partially cyclic-shifted is illustrated by way of example.

The training data generator 410 may divide the error vector into a plurality of partial sections corresponding to cyclic permutation matrices (CPMs). For example, as illustrated in FIG. 6, when the error vector includes 32 binary values, the error vector may be divided into eight partial sections, that is, a first partial section to an eight partial section. Four binary values included in each of the eight partial sections (i.e., the first partial section to the eight partial section) may be referred to as a "partial error vector".

The training data generator 410 may cyclic-shift the respective vectors included in the partial sections by the same shift amount. For example, as illustrated in FIG. 6, the training data generator 410 may generate cyclic-shifted error vectors by cyclic-shifting a vector {0100} included in a first partial section, a vector {0001} included in a third partial section, and a vector {1000} included in an eighth partial section by the same shift amount.

For example, the training data generator 410 may generate a partially cyclic-shifted first error vector by cyclic-shifting vectors included in respective partial sections by a shift amount of 1, may generate a partially cyclic-shifted second error vector by cyclic-shifting vectors included in respective partial sections by a shift amount of 2, or may generate a partially cyclic shifted third error vector by cyclic-shifting vectors included in respective partial sections by a shift amount of 3.

When the size of each cyclic permutation matrix is z x z, z−1 pieces of training data may be additionally acquired from one piece of training data.

FIG. 7 is an example diagram illustrating a training data generation method according to an embodiment of the disclosed technology.

When training data is generated, the characteristics of a linear code may be utilized. When the same error vector is added to each of codewords included in a null space defined by a parity check matrix due to the characteristics of a linear code, the same syndrome may be caused.

Therefore, the training data generator 410 may determine each of vectors, generated by adding the error vector to each of the codewords included in the null space, to be a first input vector. Here, the training data generator 410 may determine each codeword belonging to the null space to be a target vector. That is, one codeword included in the null space and a vector, generated by adding the error vector to the one codeword, may form one piece of training data. Therefore, when u codewords are included in the null space, u pieces of training data may be generated using one error vector.

Figure 8:
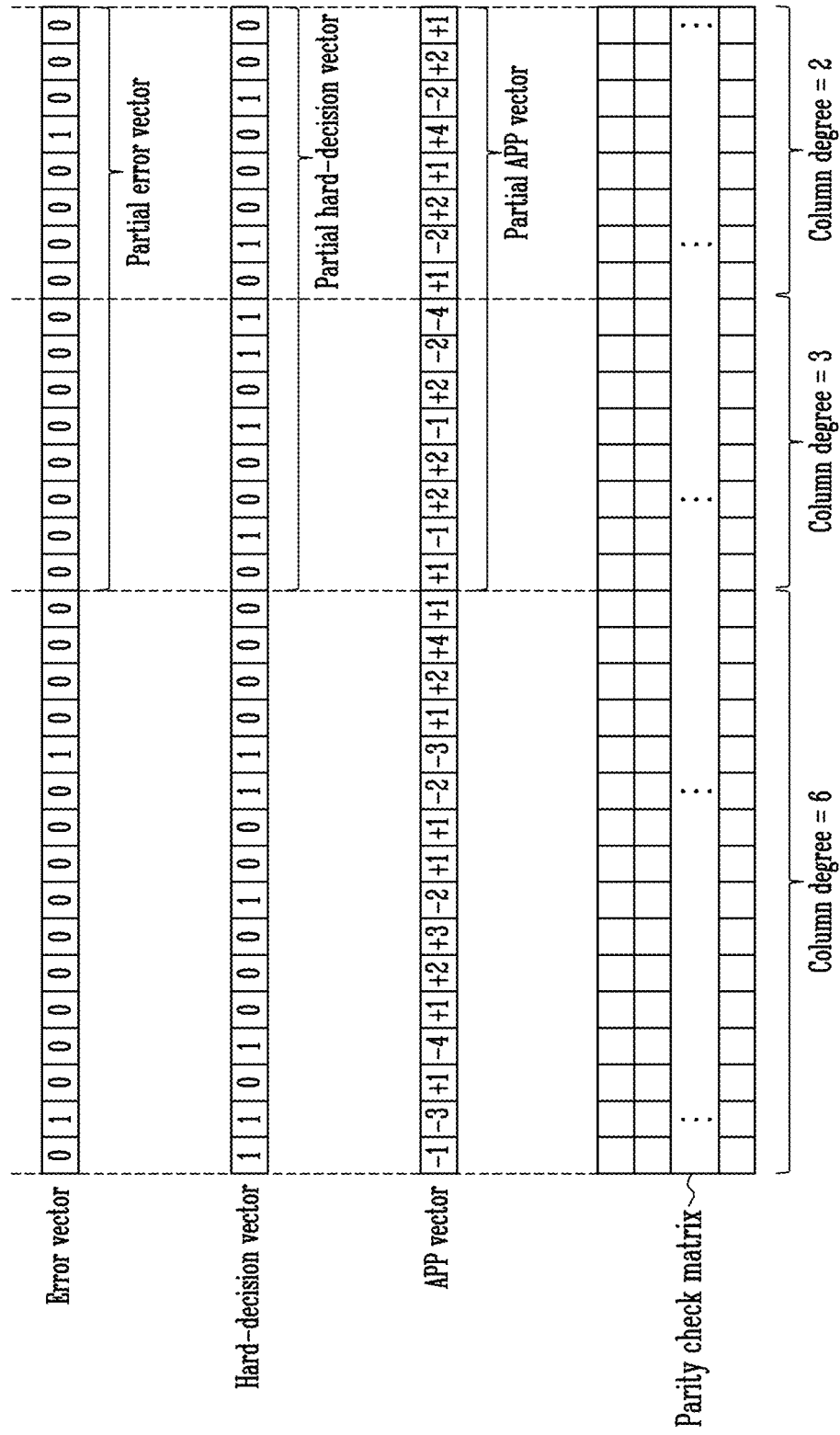
FIG. 8 is an example diagram illustrating a training data generation method according to an embodiment of the present disclosure.

FIG. 8 is an example diagram illustrating a training data generation method according to an embodiment of the disclosed technology.

In an irregular parity check matrix, degrees of respective columns may differ from each other. For example, as illustrated in FIG. 8, the column degree of some columns of the parity check matrix may be 6, the column degree of some other columns thereof may be 3, and the column degree of other columns thereof may be 2.

The training data generator 410 may determine a partial vector composed of values corresponding to columns having a specific column degree, among columns included in the irregular parity check matrix, to be a first input vector.

In an embodiment, the training data generator 410 may determine a partial vector composed of values corresponding to columns having a relatively low column degree, among columns included in the irregular parity check matrix, to be a first input vector. In FIG. 8, an example in which a partial vector composed of values corresponding to columns having a column degree of 3 and a column degree of 2 lower than a column degree of 6 is determined to be an input vector to be input to the artificial neural network is illustrated by way of example.

For example, the training data generator 410 may determine a partial error vector composed of binary values corresponding to a column degree of 3 and a column degree of 2, among binary values included in the error vector, to be the first input vector.

For example, the training data generator 410 may determine a partial hard-decision vector composed of binary values corresponding to a column degree of 3 and a column degree of 2, among binary values included in a hard-decision vector, to be the input vector to be input to the artificial neural network.

For example, the training data generator 410 may determine a partial a-posteriori probability vector (partial APP vector) composed of LLR values corresponding to a column degree of 3 and a column degree of 2, among LLR values included in an a-posteriori probability (APP) vector, to be the input vector to be input to the artificial neural network.

Figure 9:
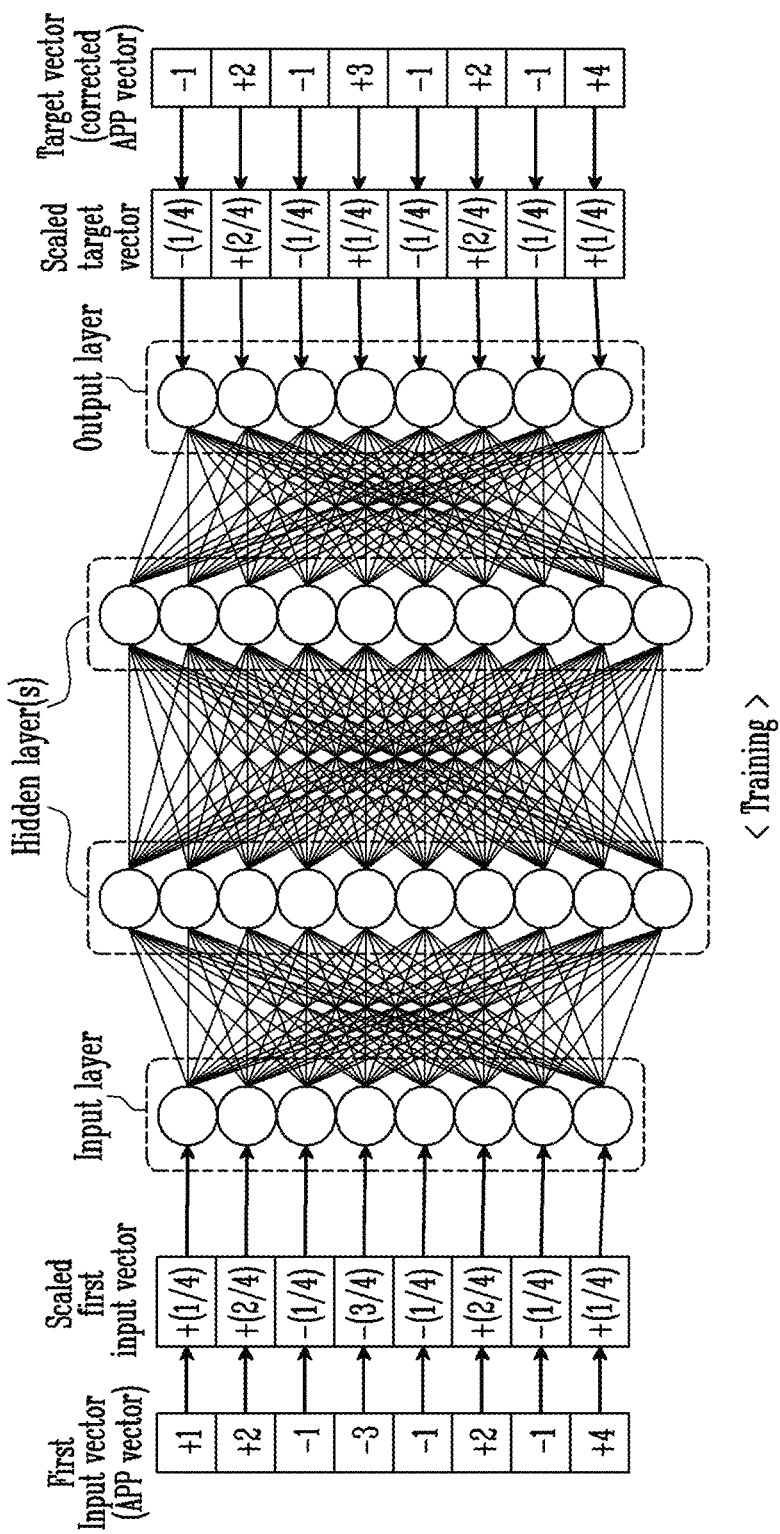
FIG. 9 is an example diagram illustrating a process for scaling training data.

FIG. 9 is an example diagram illustrating a process for scaling training data.

In FIG. 9, a case where an APP vector is determined to be a first input vector and a corrected APP vector is determined to be a target vector is illustrated by way of example.

The first scaling component 420 may scale LLR values so that LLR values included in the a-posteriori probability (APP) vector and LLR values included in the corrected APP vector have values falling within a preset range. For example, the first scaling component 420 may scale the LLR values based on the forgoing Equation (3).

In FIG. 9, a case where LLR values are scaled by multiplying a scaling factor by the LLR values included in the APP vector and the corrected APP vector is illustrated by way of example. The scaling factor may be arbitrarily or experimentally determined, and an example in which +¼ that is a reciprocal of a maximum LLR value of +4 is selected as the scaling factor is illustrated in FIG. 9.

The first scaling component 420 may generate a scaled first input vector and a scaled target vector by multiplying the scaling factor by each of the LLR values. The scaled first input vector may be input to an input layer, and the scaled target vector may be input to an output layer.

Meanwhile, as described above, in accordance with an embodiment, scaling may not be performed, and in this case, the first input vector and the target vector may be input to the artificial neural network without change.

Figure 10:
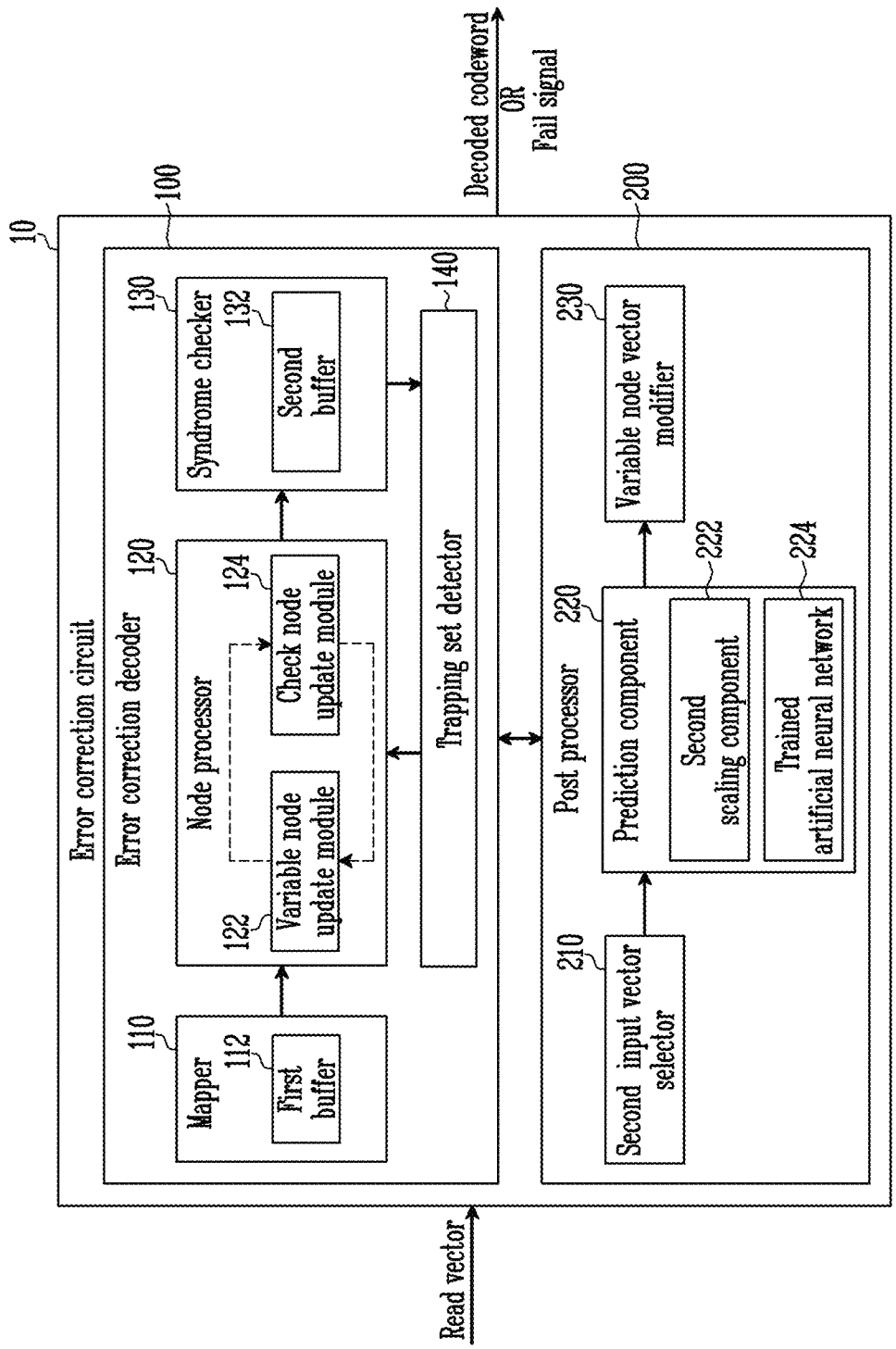
FIG. 10 is an example diagram illustrating an error correction circuit according to an embodiment of the present disclosure.

FIG. 10 is an example diagram illustrating an error correction circuit according to an embodiment of the disclosed technology.

In an embodiment, an error correction circuit 10 illustrated in FIG. 10 may be included in the electronic device 40 illustrated in FIG. 4.

In an embodiment, the error correction circuit 10 illustrated in FIG. 10 may include the electronic device 40 illustrated in FIG. 4.

The error correction circuit 10 may include an error correction decoder 100 and a post processor 200.

The error correction decoder 100 may perform error correction decoding using various algorithms which adopt an iterative decoding scheme. For example, the error correction decoder 100 may perform error correction decoding using a message passing algorithm (MPA) that is also referred to as a "belief propagation algorithm (BPA)". For example, the error correction decoder 100 may perform error correction decoding using at least one of a bit-flip algorithm, a sum-product algorithm, a min-sum algorithm, or a scaled min-sum algorithm, but the embodiments of the disclosed technology are not limited thereto.

The error correction decoder 100 may perform at least one iteration within the preset maximum number of iterations I. In some implementations, the iteration is referred to as i-th iteration with the iteration number (i) that is less than I. In implementations, i and I may be natural numbers. When a valid codeword that satisfies constraints for the parity check matrix of the error correction code (ECC) is generated within the maximum number of iterations I, the error correction decoder 100 may output the generated valid codeword as a decoded codeword. When a valid codeword that satisfies the constraints for the parity check matrix of the error correction code is not generated within the maximum number of iterations I, the error correction decoder 100 may output a fail signal indicating that error correction decoding has failed.

The error correction decoder 100 may use a graph-based error correction code, for example, at least one of an LDPC code or a turbo code, as an error correction code, but embodiments of the disclosed technology are not limited thereto.

The error correction decoder 100 may include a mapper 110, a node processor 120, a syndrome checker 130, and a trapping set detector 140.

The mapper 110 may receive a read vector from a channel. The read vector may be the result of reading a codeword stored in, for example, a memory device. Each of read values included in the read vector may be '0' or '1'. When hard-decision decoding is used, one read vector corresponding to one codeword may be received. When soft-decision decoding is used, a plurality of read vectors corresponding to one codeword may be received.

The mapper 110 may generate read vectors quantized into g+1 levels using g read vectors corresponding to one codeword. Here, g may be a natural number. Each of read values included in the read vectors quantized into g+1 levels may be a read value quantized into g+1 levels. Each read value quantized into g+1 levels may be a read pattern (e.g., a bit sequence) composed of g binary values. For example, each of the read values quantized into two levels may be '1' or '0'. For example, one of the read values quantized into two levels may be '1', and the remaining one thereof may be '0'. For example, each of the read values quantized into three levels may be '11', '10', '01' or '00'. For example, one of the read values quantized into three levels may be '11', another may be '00', and the other may be '10' or '01'.

When hard-decision decoding is used (i.e., when g is 1), the mapper 110 may determine that a single read vector itself is a read vector quantized into two levels.

When soft-decision decoding is used (i.e., when g is equal to or greater than 2), the mapper 110 may generate read vectors quantized into g+1 levels by combining g read vectors. The mapper 110 may include a first buffer 112. When quantization level g+1 is used, the first buffer 112 may receive and store g read vectors. The mapper 110 may generate read vectors quantized into g+1 levels by combining the g read vectors stored in the first buffer 112.

The mapper 110 may convert each of the read vectors quantized into g+1 levels into an initial log likelihood ratio (LLR) vector. The initial LLR vector may include a plurality of initial LLR values. That is, the mapper 110 may convert each of read values, quantized into g+1 levels, into an initial LLR value.

The mapper 110 may provide the initial LLR vector to the node processor 120. The provision of the initial LLR vector may be performed at an initialization step and in each iteration.

The node processor 120 may perform error correction decoding using a message passing algorithm based on the initial LLR vector received from the mapper 110. The message passing algorithm enables the generation of a result which converges on a codeword via the exchange of messages performed between variable nodes and check nodes. The messages may include Variable to Check (V2C) messages that are sent from the variable nodes to the check nodes and Check to Variable (C2V) messages that are sent from the check nodes to the variable nodes.

The node processor 120 may perform at least one iteration within the maximum number of iterations I. The node processor 120 may perform the iteration using at least one of various scheduling techniques, for example, a flooding technique, a column-layered technique, or a row-layered technique. Hereinafter, an example in which error correction decoding is performed depending on the flooding technique will be described, but embodiments of the disclosed technology are not limited thereto.

The node processor 120 may include a variable node update module 122 and a check node update module 124.

The variable node update module 122 may initialize the variable nodes using the initial LLR vector received from the mapper 110 at the initialization step. For example, the variable node update module 122 may assign the initial LLR values included in the initial LLR vector to respective variable nodes one by one.

The variable node update module 122 may generate V2C messages and send the V2C messages to the check node update module 124 in a first iteration so that the initial LLR values of respective variable nodes are transferred to check nodes coupled to the corresponding variable nodes.

The variable node update module 122 may generate V2C messages based on the C2V messages, received from the check node update module 124, and send the generated V2C messages to the check node update module 124 in respective iterations except the first iteration. In accordance with an embodiment, the variable node update module 122 may also generate V2C messages in further consideration of the initial LLR vector received from the mapper 110.

The variable node update module 122 may update the values of the variable nodes based on the C2V messages received from the check node update module 124 in respective iterations. In accordance with an embodiment, the variable node update module 122 may update the values of the variable nodes in further consideration of the initial LLR vector received from the mapper 110. The update of the values of variable nodes may mean that the a-posteriori probability (APP) of each variable node is calculated. In accordance with an embodiment, the update of the values of the variable nodes may mean that the a-posteriori probability (APP) of each variable node is calculated and the hard-decision value of the corresponding variable node is determined based on the calculated APP. A hard-decision value of a variable node having a negative APP value may be determined to be '1', whereas a hard-decision value of each variable node having an APP value other than a negative value may be determined to be '0'.

The check node update module 124 may update the values of the check nodes based on the V2C messages received from the variable node update module 122 in respective iterations.

The check node update module 124 may generate C2V messages based on the V2C messages, received from the variable node update module 122, and send the generated C2V messages to the variable node update module 122 in respective iterations.

The node processor 120 may provide hard-decision values of the variable nodes (hereinafter referred to as a "hard-decision vector $C_i$") corresponding to an i-th iteration to the syndrome checker 130. In some implementations, i denotes a natural number that is equal to or less than I. Although the hard-decision vector $C_i$ may be a row vector or a column vector, a description will be made on the assumption that the hard-decision vector $C_i$ is a row vector.

When a valid codeword that satisfies constraints for a parity check matrix of an error correction code is generated within the maximum number of iterations I, the syndrome checker 130 may output the generated valid codeword as a decoded codeword. For example, the syndrome checker 130 may store the hard-decision vector $C_i$, received from the node processor 120 in accordance with the i-th iteration, in a second buffer 132, and may perform a syndrome check on the received hard-decision vector $C_i$. For example, the syndrome check may be performed by checking whether all entries of a syndrome vector Si calculated by the following Equation (4) are '0'.

$$S_i = H \cdot C_i^T \qquad (4)$$

where, $S_i$ denotes a syndrome vector corresponding to the i-th iteration, H denotes the parity check matrix of the error correction code, and $C_i^T$ denotes a transposed matrix of the hard-decision vector $C_i$ corresponding to the i-th iteration.

A case where all entries of the syndrome vector $S_i$ are '0' means that the syndrome vector $S_i$ has passed the syndrome check. This means that error correction decoding has been successfully performed in the i-th iteration, and thus the syndrome checker 130 may output the hard-decision vector $C_i$, stored in the second buffer 132, as a decoded codeword.

If an entry other than '0' (non-zero entry) is present among the entries of the syndrome vector $S_i$, it means that the syndrome vector $S_i$ has failed in the syndrome check. This means that error correction decoding has failed in the i-th iteration, and thus the node processor 120 may perform an (i+1)-th iteration when a current iteration falls within the maximum number of iterations I. Among the entries of the syndrome vector $S_i$, a check node corresponding to the non-zero entry may be referred to as an unsatisfied check node (UCN), and a check node corresponding to an entry of '0' (zero-entry) may be referred to as a satisfied check node (SCN).

In an embodiment, when the syndrome check corresponding to the i-th iteration fails, the syndrome checker 130 may calculate the number of UCNs corresponding to the i-th iteration, and may provide information about the calculated number of UCNs to the trapping set detector 140.

When a trapping set is detected during error correction decoding, the trapping set detector 140 may notify the post processor 200 that the trapping set has been detected. For example, the trapping set detector 140 may receive the information about the number of UCNs from the syndrome checker 130 in each iteration, and may store the received information about the number of UCNs. The trapping set detector 140 may detect a trapping set based on the information about the number of UCNs. For example, when there is no change in the number of UCNs, when the number of UCNs monotonously increases, or when the number of UCNs vibrationally diverges, during a series of iterations corresponding to a preset number of iterations, the trapping set detector 140 may determine that there is a trapping set.

When notification that the trapping set has been detected is received from the trapping set detector 140, the post processor 200 may support the error correction decoder 100 so that the error correction decoder 100 is capable of generating a valid codeword.

When the notification that the trapping set has been detected in the i-th iteration is received, the post processor 200 may correct a variable node vector corresponding to the i-th iteration using a trained artificial neural network 224. The variable node vector corresponding to the i-th iteration may include at least one of an a-posteriori probability vector (APP) vector corresponding to the i-th iteration, a partial APP vector corresponding to the i-th iteration, a hard-decision vector corresponding to the i-th iteration, or a partial hard-decision vector corresponding to the i-th iteration.

The post processor 200 may include a second input vector selector 210, a prediction component 220, and a variable node vector modifier 230.

When the notification that a trapping set has been detected in an i-th iteration is received, the second input vector selector 210 may select a second input vector to be inputted to the trained artificial neural network 224, and may provide the selected input vector to the prediction component 220.

In an embodiment, the second input vector selector 210 may select, as a second input vector to be inputted to the input layer of the trained artificial neural network 224, the hard-decision vector corresponding to the i-th iteration or the a-posteriori probability (APP) vector corresponding to the i-th iteration.

In an embodiment, the second input vector selector 210 may select, as the second input vector to be inputted to the input layer of the trained artificial neural network 224, a partial hard-decision vector which is a part of the hard-decision vector corresponding to the i-th iteration, or a partial APP vector which is a part of the APP vector corresponding to the i-th iteration.

In an embodiment, the second input vector selector 210 may select a syndrome vector corresponding to the i-th iteration as the second input vector to be inputted to the input layer of the trained artificial neural network 224.

The prediction component 220 may include a second scaling component 222 and the trained artificial neural network 224.

The prediction component 220 may input the second input vector, which is received from the second input vector selector 210, to the trained artificial neural network 224, or may input a scaled input vector to the trained artificial neural network 224.

The prediction component 220 may provide a predicted vector output from the artificial neural network 224 to the variable node vector modifier 230 or provide the scaled predicted vector to the variable node vector modifier 230.

The second scaling component 222 may scale the second input vector selected by the second input vector selector 210. The scaling of the second input vector may be performed based on the same or similar manner as the scaling of the above-described first input vector. For example, when the second input vector includes binary values, scaling may be performed based on the above-described Equation (2). For example, when the second input vector includes LLR values, scaling may be performed based on the above-described Equation (3) or may be performed such that a scaling factor is applied to the second input vector.

The second scaling component 222 may scale predicted values, for example, the predicted vector, which are outputted from the output layer of the trained artificial neural network 224. The second scaling component 222 may convert values included in the predicted vector into binary values, quantized LLR values, or real-type LLR values by scaling the values included in the predicted vector.

In accordance with an embodiment, scaling may not be performed, and in this case, the second scaling component 222 may be omitted.

The trained artificial neural network 224 may be trained in advance so as to break the trapping set, as described above with reference to FIGS. 3 to 9.

The variable node vector modifier 230 may modify at least one of the hard-decision vector, the partial hard-decision vector, the APP vector, or the partial APP vector, which corresponds to the i-th iteration, based on the predicted vector or the scaled predicted vector received from the prediction component 220.

In an embodiment, when the hard-decision vector corresponding to the i-th iteration is selected as the second input vector, the variable node vector modifier 230 may modify the hard-decision vector corresponding to the i-th iteration based on the predicted vector. For example, the variable node vector modifier 230 may modify binary values included in the hard-decision vector corresponding to the i-th iteration so that the binary values correspond to respective signs of predicted values included in the predicted vector. For example, the variable node vector modifier 230 may modify a binary value corresponding to a predicted value having a negative value to '1' and may modify a binary value corresponding to a predicted value other than a negative value to '0'.

In an embodiment, when the hard-decision vector corresponding to the i-th iteration is selected as the second input vector, the variable node vector modifier 230 may modify the hard-decision vector corresponding to the i-th iteration based on the scaled predicted vector. For example, the variable node vector modifier 230 may modify the hard-decision vector corresponding to the i-th iteration so that the hard-decision vector is identical to the scaled predicted vector.

In an embodiment, when the APP vector corresponding to the i-th iteration is selected as the second input vector, the variable node vector modifier 230 may modify the hard-decision vector corresponding to the i-th iteration based on the predicted vector or the scaled predicted vector. For example, the variable node vector modifier 230 may modify binary values included in the hard-decision vector corresponding to the i-th iteration so that the binary values correspond to respective signs of predicted values included in the predicted vector or the scaled predicted vector.

In an embodiment, when the partial hard-decision vector corresponding to the i-th iteration is selected as the second input vector, the variable node vector modifier 230 may modify the partial hard-decision vector corresponding to the i-th iteration based on the predicted vector. For example, the variable node vector modifier 230 may modify binary values included in the partial hard-decision vector corresponding to the i-th iteration so that the binary values correspond to respective signs of predicted values included in the predicted vector.

In an embodiment, when the partial hard-decision vector corresponding to the i-th iteration is selected as the second input vector, the variable node vector modifier 230 may modify the partial hard-decision vector corresponding to the i-th iteration based on the scaled predicted vector. For example, the variable node vector modifier 230 may modify the partial hard-decision vector corresponding to the i-th iteration so that the partial hard-decision vector is identical to the scaled predicted vector.

In an embodiment, when the partial APP vector corresponding to the i-th iteration is selected as the second input vector, the variable node vector modifier 230 may modify the partial hard-decision vector corresponding to the i-th iteration based on the predicted vector or the scaled predicted vector. For example, the variable node vector modifier 230 may modify binary values included in the partial hard-decision vector corresponding to the i-th iteration so that the binary values correspond to respective signs of predicted values included in the predicted vector or the scaled predicted vector.

In an embodiment, when the syndrome vector corresponding to the i-th iteration is selected as the second input vector, the variable node vector modifier 230 may modify the hard-decision vector corresponding to the i-th iteration based on the predicted vector or the scaled predicted vector. For example, the variable node vector modifier 230 may flip a binary value corresponding to a predicted value having a positive value, among predicted values included in the predicted vector or the scaled predicted vector, and may maintain a binary value corresponding to a predicted value other than a positive value without change.

In an embodiment, the variable node vector modifier 230 may control the syndrome checker 130 so that a syndrome check is performed on the hard-decision vector including the modified hard-decision vector or the modified partial hard-decision vector.

In an embodiment, when the hard-decision vector including the modified hard-decision vector or the modified partial hard-decision vector passes the syndrome check, the variable node vector modifier 230 may control the syndrome checker 130 so that the hard-decision vector including the modified hard-decision vector or the modified partial hard-decision vector is output as a decoded codeword.

In an embodiment, when the hard-decision vector including the modified hard-decision vector or the modified partial hard-decision vector fails in the syndrome check, the variable node vector modifier 230 may check the number of UCNs and determine whether to perform a subsequent iteration depending on the number of UCNs.

In an embodiment, when, as a result of performing a syndrome check on the hard-decision vector including the modified hard-decision vector or the modified partial hard-decision vector, iterations are performed so that the number of iterations reaches the preset maximum number of iterations I, the variable node vector modifier 230 may output a fail signal indicating that error correction decoding has failed. In other embodiments, even if the number of iterations has not reached the preset maximum number of iterations I, when the number of UCNs is greater than a preset reference value, the variable node vector modifier 230 may output a fail signal indicating that error correction decoding has failed.

In an embodiment, when, as a result of performing a syndrome check on the hard-decision vector including the modified hard-decision vector or the modified partial hard-decision vector, the number of iterations has not yet reached the preset maximum number of iterations I, the variable node vector modifier 230 may modify the APP vector or the partial APP vector, and may control the node processor 120 so that a subsequent iteration is performed using the APP vector including the modified APP vector or the modified partial APP vector. Modification of the APP vector or the partial APP vector may mean that at least one of the signs or the magnitudes of LLR values included in the APP vector or the partial APP vector are modified.

For example, the variable node vector modifier 230 may modify the LLR values included in the APP vector so that the LLR values correspond to respective binary values included in the modified hard-decision vector or so that the LLR values correspond to respective binary values included in the modified partial hard-decision vector. For example, the variable node vector modifier 230 may modify the APP vector so that the APP vector is identical to the predicted vector or the scaled predicted vector, or may modify the partial APP vector so that the partial APP vector is identical to the predicted vector or the scaled predicted vector.

In other embodiments, when the number of iterations has not reached the preset maximum number of iterations I and the number of UCNs is not greater than the preset reference value, the variable node vector modifier 230 may modify the APP vector or the partial APP vector, and may control the node processor 120 so that a subsequent iteration is performed using the APP vector including the modified APP vector or the modified partial APP vector.

Figure 11:
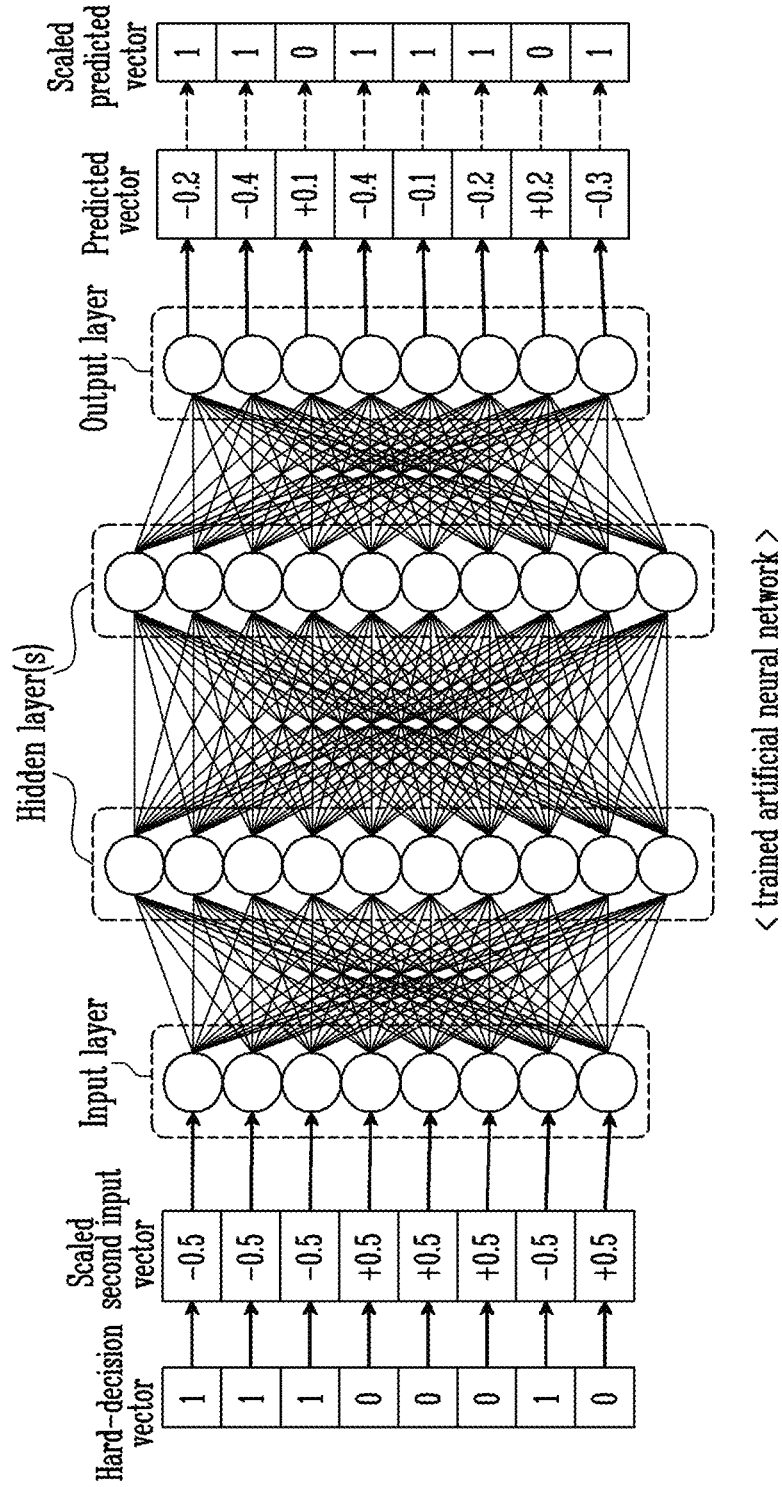
FIG. 11 is an example diagram illustrating a process for performing error correction decoding using a trained artificial neural network.

FIG. 11 is an example diagram illustrating a process for performing error correction decoding using a trained artificial neural network.

In FIG. 11, a case where a hard-decision vector {11100010} corresponding to an i-th iteration, in which a trapping set is detected, is scaled based on Equation (2), and then a scaled second input vector is generated is illustrated by way of example.

When the scaled second input vector {−0.5 −0.5 −0.5 +0.5 +0.5 +0.5 −0.5 +0.5} is input to the input layer of the trained artificial neural network, a predicted vector {−0.2 −0.4 +0.1 −0.4 −0.1 −0.2 +0.2 −0.3} may be output from the output layer of the trained artificial neural network.

The post processor 200 may generate a scaled predicted vector {11011101} by scaling the predicted vector {−0.2 −0.4 +0.1 −0.4 −0.1 −0.2 +0.2 −0.3}. In FIG. 11, an example in which, among values included in the predicted vector {−0.2 −0.4 +0.1 −0.4 −0.1 −0.2 +0.2 −0.3}, negative values are scaled to '1' and values other than negative values are scaled to '0' is illustrated by way of example.

The post processor 200 may modify the hard-decision vector so that the hard-decision vector is identical to the scaled predicted vector {11011101}, and may control the syndrome checker 130 so that a syndrome check is performed on the modified hard-decision vector. The post processor 200 may control the syndrome checker 130 so that the decoded codeword is output, may control the node processor 120 so that a subsequent iteration is performed, or may output a fail signal indicating that error correction decoding has failed, based on the result of the syndrome check.

For example, the post processor 200 may control the syndrome checker 130 so that, when the syndrome check has passed, the hard-decision vector {11011101} is output as a decoded codeword.

For example, when the syndrome check has failed and the number of UCNs is less than the number of UCNs at which a trapping set is detected, the post processor 200 may modify the APP vector to match the hard-decision vector {11011101}, and may control the node processor 120 so that a subsequent iteration is performed using the modified APP vector.

For example, when the syndrome check has failed and the number of UCNs is greater than the number of UCNs at which a trapping set is detected, the post processor 200 may output a fail signal indicating that error correction decoding has failed.

Figure 12:
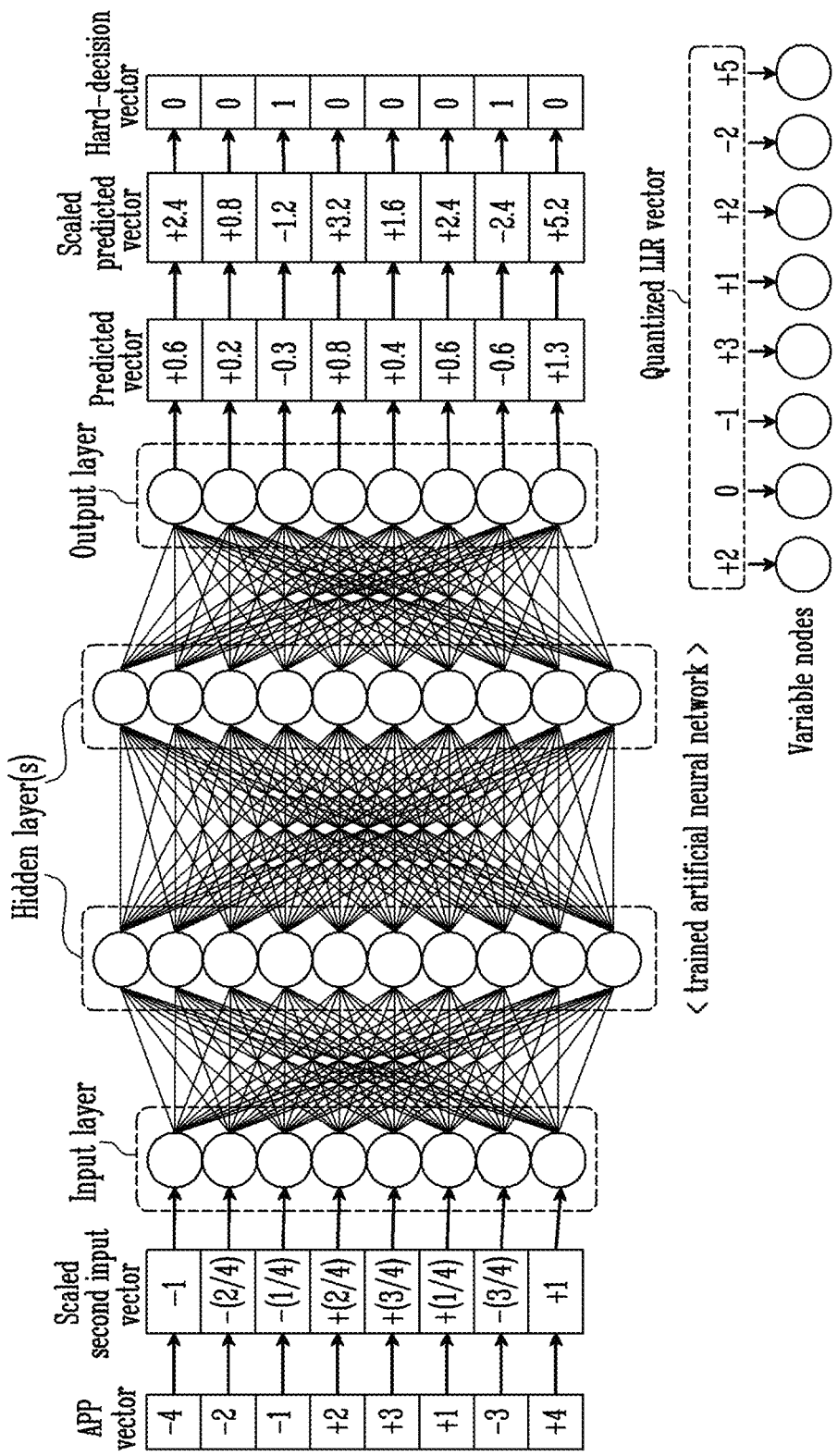
FIG. 12 is an example diagram illustrating a process for performing error correction decoding using a trained artificial neural network.

FIG. 12 is an example diagram illustrating a process for performing error correction decoding using a trained artificial neural network.

In FIG. 12, a case where a reciprocal (+¼) of a maximum LLR value (+4), among LLR values included in an a-posteriori probability (APP) vector {−4 −2 −1 +2 +3 +1 −3 +4} corresponding to an i-th iteration in which a trapping set is detected, is applied, as a scaling factor, to the APP vector {−4 −2 −1 +2 +3 +1 −3 +4}, and then a scaled second input vector is generated is illustrated by way of example.

When the scaled second input vector {−1 −(2/4) −(¼) +(2/4) +(¾) +(¼) −(¾) +1} is input to the input layer of the trained artificial neural network, a predicted vector {+0.6 +0.2 −0.3 +0.8 +0.4 +0.6 −0.6 +1.3} may be output from the output layer of the trained artificial neural network.

The post processor 200 may scale the predicted vector {+0.6 +0.2 −0.3 +0.8 +0.4 +0.6 −0.6 +1.3}, and then generate the scaled predicted vector {+2.4 +0.8 −1.2 +3.2 +1.6 +2.4 −2.4 +5.2}. In FIG. 12, a case where the maximum LLR value (+4) is applied, as the scaling factor, to the predicted vector {+0.6 +0.2 −0.3 +0.8 +0.4 +0.6 −0.6 +1.3} is illustrated by way of example.

The post processor 200 may convert the scaled predicted vector {+2.4 +0.8 −1.2 +3.2 +1.6 +2.4 −2.4 +5.2} into a hard-decision vector {00100010}. In FIG. 12, a case where, among values included in the scaled predicted vector, negative values are converted into '1' and values other than negative values are converted into '0' is illustrated by way of example.

The post processor 200 may control the syndrome checker 130 so that a syndrome check is performed using the hard-decision vector {00100010}, may control the syndrome checker 130 so that a decoded codeword is output based on the result of the syndrome check, may control the node processor 120 so that a subsequent iteration is performed, or may output a fail signal indicating that error correction decoding has failed.

For example, the post processor 200 may control the syndrome checker 130 so that, when the syndrome check has passed, the hard-decision vector {00100010} is output as a decoded codeword.

For example, when the syndrome check has failed, and the number of UCNs is greater than the number of UCNs at which a trapping set is detected, the post processor 200 may output a fail signal indicating that error correction decoding has failed.

For example, when the syndrome check has failed and the number of UCNs is less than the number of UCNs at which the trapping set is detected, the post processor 200 may modify the APP vector to match the hard-decision vector {00100010}, and may control the node processor 120 so that a subsequent iteration is performed using the modified APP vector.

In an embodiment, the post processor 200 may modify the APP vector so that the modified APP vector is identical to the predicted vector {+0.6 +0.2 −0.3 +0.8 +0.4 +0.6 −0.6 +1.3} or the scaled predicted vector {+2.4 +0.8 −1.2 +3.2 +1.6 +2.4 −2.4 +5.2}.

In an embodiment, the post processor 200 may generate a quantized LLR vector {+2 0 −1 +3 +1 +2 −2 +5} by appropriately processing (e.g., rounding up, rounding down, or rounding off) the scaled predicted vector {+2.4 +0.8 −1.2 +3.2 +1.6 +2.4 −2.4 +5.2}, and may modify the APP vector so that the modified APP vector is identical to the quantized LLR vector. In accordance with an embodiment, the post processor 200 may modify an LLR value (+5.2) greater than the maximum allowable LLR value (4) to the maximum LLR value (4).

FIG. 13 is an example diagram illustrating a parity check matrix.

An (N, K) code may be defined as a parity check matrix having a size of M×N. Here, K denotes the length of original data and M denotes the number of parity bits, where M=N−K. Each entry of the parity check matrix may be represented by '0' or '1'. The (N, K) code may be referred to as an "(N, K) LDPC code" when the number of 1s included in the parity check matrix is much less than the number of 0s. Here, N and K may be natural numbers. In FIG. 13, as an example, a parity check matrix H defining a (7, 4) code is illustrated.

A matrix in which each entry is implemented as a sub-matrix may be referred to as a "base matrix". Each entry of the base matrix may be a sub-matrix having a z×z size. Here, z may be an integer of 2 or more. For example, in the base matrix of a binary LDPC code, '0' may indicate that the corresponding entry is a zero matrix, and '1' may indicate that the corresponding entry is not a zero matrix. For example, in the base matrix of a Quasi Cyclic (QC)-LDPC code, '1' may indicate that the corresponding entry is a cyclic permutation matrix. The cyclic permutation matrix may be a matrix obtained by cyclic-shifting an identity matrix by a predetermined shift amount (value), and any one cyclic permutation matrix may have a shift value different from that of another cyclic permutation matrix.

Figure 14:
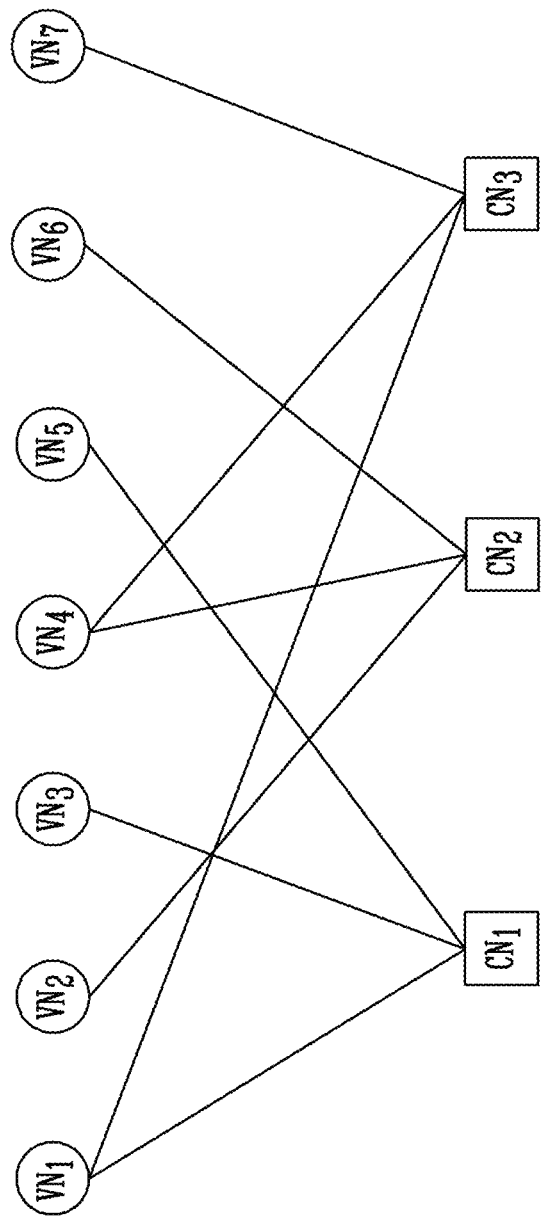
FIG. 14 is a diagram illustrating the parity check matrix of FIG. 13 as a Tanner graph.

FIG. 14 is a diagram illustrating the parity check matrix of FIG. 13 as a Tanner graph.

An (N, K) code may be represented by a Tanner graph which is an expression of an equivalent bipartite graph. The Tanner graph may be represented by N−K check nodes, N variable nodes, and edges. The check nodes may correspond to the rows of the parity check matrix, and the variable nodes may correspond to the columns of the parity check matrix. Each edge couples one check node to one variable node, and indicates an entry represented by '1' in the parity check matrix.

The parity check matrix of the (7, 4) code illustrated in FIG. 13 may be represented by a Tanner graph including three check nodes $CN_1$ to $CN_3$ and seven variable nodes $VN_1$ to $VN_7$, as illustrated in FIG. 14. Solid lines for coupling the check nodes $CN_1$ to $CN_3$ to the variable nodes $VN_1$ to $VN_7$ indicate edges.

Iterative decoding may be implemented through the exchange of messages that is iteratively performed between the check nodes $CN_1$ to $CN_3$ and the variable nodes $VN_1$ to $VN_7$.

FIG. 15 is an example diagram illustrating a syndrome vector calculated using the parity check matrix of FIG. 13.

As described above, a syndrome vector $S_i$ may be generated based on a parity check matrix H and a transposed matrix $C_i^T$ of a hard-decision vector $C_i$ corresponding to an i-th iteration. Respective entries $C_{i1}, C_{i2}, C_{i3}, \ldots, C_{i7}$ of the hard-decision vector $C_i$ denote hard-decision values of variable nodes corresponding to the i-th iteration. Respective entries $S_{i1}, S_{i2}$, and $S_{i3}$ of the syndrome vector $S_i$ correspond to respective check nodes $CN_1, CN_2$, and $CN_3$ on the Tanner graph illustrated in FIG. 14.

A case where all of the entries $S_{i1}, S_{i2}$, and $S_{i3}$ of the syndrome vector $S_i$ indicate '0' means that the syndrome vector has passed a syndrome check. This means that, in the corresponding iteration, error correction decoding has been successfully performed. Therefore, iterative decoding may be terminated, and the hard-decision vector $C_i$ corresponding to the i-th iteration may be output as a decoded codeword.

A case where at least one of the entries $S_{i1}, S_{i2}$, and $S_{i3}$ of the syndrome vector $S_i$ is not zero ('0') means that the syndrome vector has failed in the syndrome check. This means that, in the corresponding iteration, error correction decoding has not been successful. Thus, when the current iteration has not reached the maximum number of iterations I, a subsequent iteration may be performed.

Figure 16:
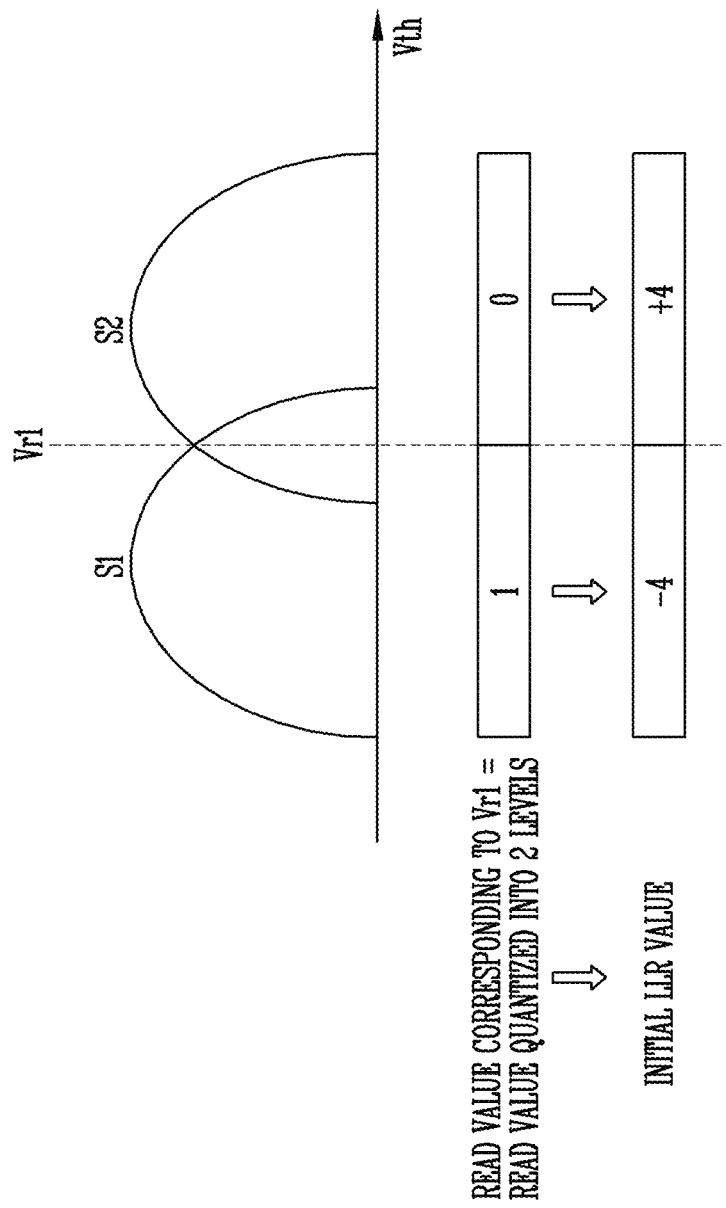
FIG. 16 is an example diagram illustrating a process for generating an initial LLR value using one read value during hard-decision decoding.

FIG. 16 is an example diagram illustrating a process for generating initial LLR values using one read value in hard-decision decoding.

In FIG. 16, threshold voltage distributions Vth of memory cells, each having any one of a first state S1 and a second state S2, are illustrated.

In order to acquire one read vector corresponding to one codeword, one read voltage may be applied to a plurality of memory cells.

For example, when a first read voltage Vr1 is applied to the plurality of memory cells, a read value from a memory cell having a threshold voltage lower than the first read voltage Vr1 may appear as '1', and a read value from a memory cell having a threshold voltage higher than the first read voltage Vr1 may appear as '0'. For example, as illustrated in FIG. 16, when one read voltage, that is, the first read voltage Vr1, is used, one read value may be acquired from each memory cell.

The error correction decoder may determine a first read value itself corresponding to the first read voltage Vr1 to be a read value quantized into two levels.

The error correction decoder may convert the read value quantized into two levels into initial LLR values. Conversion into the initial LLR values may be performed by referring to a set lookup table.

Figure 17:
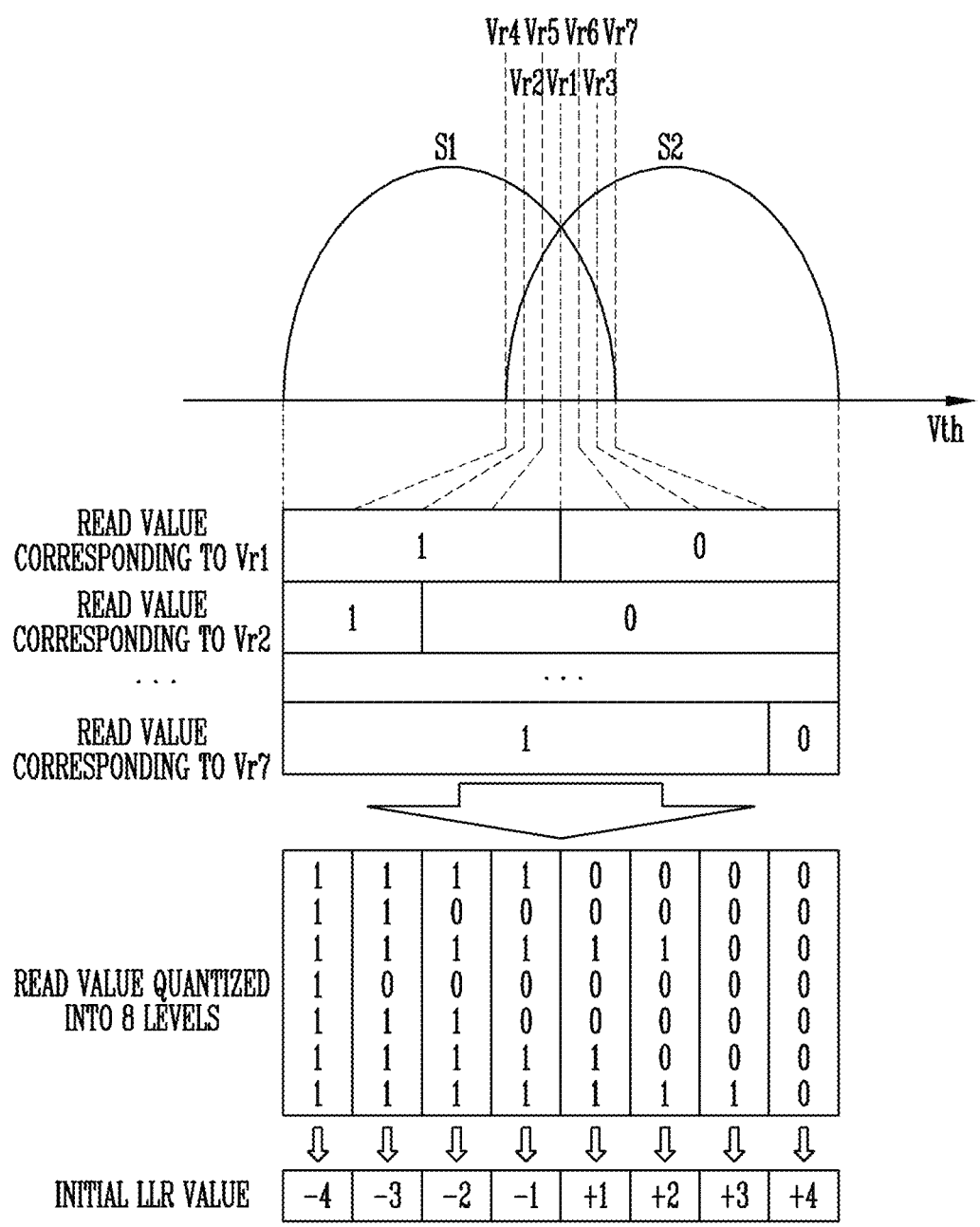
FIG. 17 is an example diagram illustrating a process for generating an initial LLR value using g read values during soft-decision decoding.

FIG. 17 is an example diagram illustrating a process for generating initial LLR values using g read values during soft-decision decoding.

In FIG. 17, threshold voltage distributions Vth of memory cells, each having any one of a first state S1 and a second state S2, are illustrated.

When quantization level g+1 is used, g read voltages may be sequentially applied to a plurality of memory cells in order to acquire g read vectors corresponding to one codeword.

For example, when quantization level 2 is used, one read voltage Vr1 may be applied to the plurality of memory cells. When quantization level 3 is used, two read voltages Vr1 and Vr2 may be sequentially applied to the plurality of memory cells. Similarly, when quantization level 8 is used, seven read voltages Vr1, Vr2, Vr3, Vr4, Vr5, Vr6, and Vr7 may be sequentially applied to the plurality of memory cells. This means that, when quantization level g+1 is used, g read values may be acquired from each memory cell.

When any one of the g read voltages is applied to the plurality of memory cells, a read value from a memory cell having a threshold voltage lower than the applied read voltage may appear as '1', and a read value from a memory cell having a threshold voltage higher than the applied read voltage may appear as '0'.

The error correction decoder may generate read values quantized into g+1 levels by combining g read values corresponding to the g read voltages. For example, as illustrated in FIG. 17, when the seven read values Vr1, Vr2, Vr3, Vr4, Vr5, Vr6, and Vr7 are used, the error correction decoder may generate read values quantized into eight levels by combining read values corresponding to the seven read voltages.

The error correction decoder may convert read values quantized into g+1 levels into initial LLR values. Conversion into the initial LLR values may be performed by referring to a set lookup table.

FIG. 18 is an example diagram illustrating a lookup table.

Referring to FIG. 18, the lookup table may define LLR values respectively corresponding to a plurality of quantization levels.

An error correction decoder may convert each of read values, quantized into g+1 levels, into any one of g+1 LLR values corresponding to quantization level g+1, with reference to the lookup table.

For example, when quantization level 2 is used, the error correction decoder may convert any one of read values, quantized into two levels, into a value of LLR1 and convert the remaining one into a value of LLR2. For example, in the read values quantized into two levels, '1' may be converted into a value of LLR1, that is, '−4', and '0' may be converted into a value of LLR2, that is, '+4'.

A read value, read values or a read vector may mean a read value, read values or a read vector quantized into g+1 levels.

Figure 19:
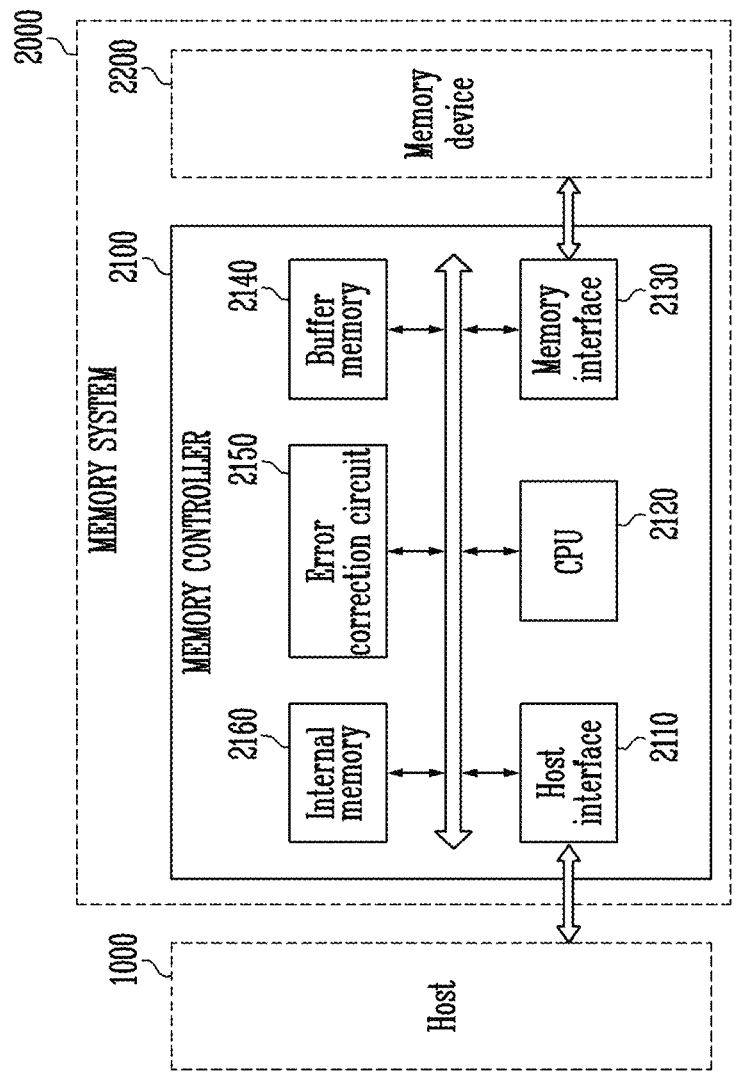
FIG. 19 is an example diagram illustrating a memory system according to an embodiment of the present disclosure.

FIG. 19 is an example diagram illustrating a memory system according to an embodiment of the disclosed technology.

A memory system 2000 may include a memory device 2200 which stores data, and a memory controller 2100 which controls the memory device 2200 in response to a request received from a host 1000.

The host 1000 may be a device or a system which stores data in the memory system 2000 or retrieves data from the memory system 2000. For example, the host 1000 may include at least one of a computer, a portable digital device, a tablet, a digital camera, a digital audio player, a television, a wireless communication device, or a cellular phone, but embodiments of the disclosed technology are not limited thereto.

The memory controller 2100 may control the overall operation of the memory system 2000. The memory controller 2100 may perform various operations in response to requests received from the host 1000.

The memory controller 2100 may perform at least one of a program operation of storing data in the memory device 2200, a read operation of reading data stored in the memory device 2200, and an erase operation of erasing data stored in the memory device 2200.

The memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the central processing unit 2120.

The host interface 2110 may communicate with the host 1000 using various interface protocols. For example, the host interface 2110 may communicate with the host 1000 using at least one of interface protocols, such as Non-Volatile Memory express (NVMe), Peripheral Component Interconnect-Express (PCI-E), Advanced Technology Attachment (ATA), Serial ATA (SATA), Parallel ATA (PATA), Universal Serial Bus (USB), Multi-Media Card (MMC), Enhanced Small Disk Interface (ESDI), Integrated Drive Electronics (IDE), Mobile Industry Processor Interface (MIPI), Universal Flash Storage (UFS), Small Computer System Interface (SCSI), or serial attached SCSI (SAS), but embodiments of the disclosed technology are not limited thereto.

The central processing unit 2120 may perform various types of calculations (operations) or generate commands and addresses so as to control the memory device 2200. For example, the central processing unit 2120 may generate various commands and addresses required for a program operation, a read operation, and an erase operation in response to requests received from the host 1000, and may transmit the generated commands and addresses to the memory interface 2130.

The central processing unit 2120 may translate a logical address, included in each request received from the host 1000, into a physical address so as to control the operation of the memory device 2200. The central processing unit 2120 may translate logical addresses into physical addresses or translate physical addresses into logical addresses by utilizing an address mapping table stored in the internal memory 2160. The central processing unit 2120 may update the address mapping table when new data is programmed to the memory device 2200 or when data stored in the memory device 2200 is erased.

The central processing unit may randomize data during a program operation, and may derandomize data during a read operation.

The memory interface 2130 may communicate with the memory device 2200 using various interface protocols.

The buffer memory 2140 may temporarily store data while the memory controller 2100 controls the memory device 2200. For example, program data received from the host 1000 may be temporarily stored in the buffer memory 2140 until a program operation is completed. Further, during a read operation, data read from the memory device 2200 may also be temporarily stored in the buffer memory 2140.

The error correction circuit 2150 may perform error correction encoding on the program data, and may perform error correction decoding on the read data. The error correction circuit 2150 may have error correction capability at a predetermined level. For example, when a number of error bits that do not exceed the error correction capability are present in the read data, the error correction circuit 2150 may detect and correct the error included in the read data. The maximum number of error bits that do not exceed the error correction capability of the error correction circuit 2150 may be regarded as the maximum allowable number of error bits. When a number of error bits that exceed the maximum allowable number of error bits are present in the read data, error correction decoding may fail.

When a trapping set is detected, the error correction circuit 2150 may break the trapping set using a trained artificial neural network. The error correction circuit 2150 may be the error correction circuit 10, described above with reference to FIG. 10.

The internal memory 2160 may be used as a storage which stores various types of information required for the operation of the memory controller 2100. The internal memory 2160 may store a plurality of tables. For example, the internal memory 2160 may store the address mapping table in which logical addresses are mapped to physical addresses. For example, the internal memory 2160 may store at least one of first to third tables.

The memory device 2200 may be implemented as a volatile memory device in which stored data is lost when the supply of power is interrupted or as a nonvolatile memory device in which stored data is retained even when the supply of power is interrupted. The memory device 2200 may perform a program operation, a read operation, an erase operation, etc. under the control of the memory controller 2100.

The memory device 2200 may include at least one storage area in which data is stored. The storage area may correspond to one page including a plurality of memory cells, one memory block including a plurality of pages, one plane including a plurality of memory blocks, or one die including a plurality of planes, but embodiments of the disclosed technology are not limited thereto.

Figure 20:
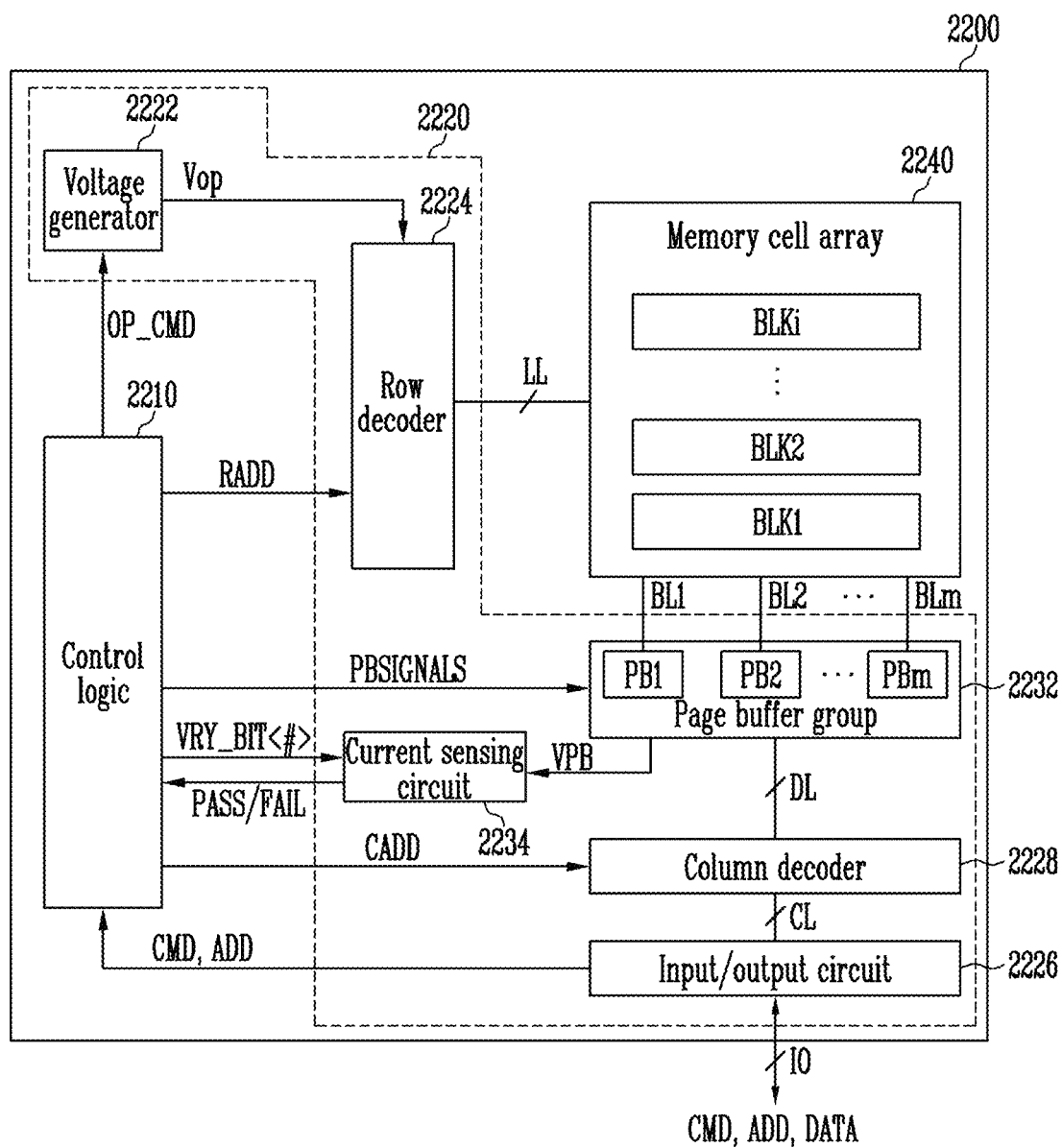
FIG. 20 is a diagram illustrating a memory device according to an embodiment of the present disclosure.

FIG. 20 is a diagram illustrating a memory device according to an embodiment of the disclosed technology.

The memory device 2200 may include a control logic 2210, peripheral circuits 2220, and a memory cell array 2240. The peripheral circuits 2220 may include a voltage generator 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 illustrated in FIG. 19.

The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PBSIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generator 2222 may generate various operating voltages Vop that are used for the program, read, and erase operations in response to the operation signal OP_CMD received from the control logic 2210. For example, the voltage generator 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (TO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to each bit line. The page buffers PB1 to PBm may be operated in response to the page buffer control signals PBSIGNALS received from the control logic 2210. For example, during a program operation, the page buffers PB1 to PBm may temporarily store program data received from the memory controller, and may control voltages to be applied to the bit lines BL1 to BLm based on the program data. Also, during a read operation, the page buffers PB1 to PBm may temporarily store data received through the bit lines BL1 to BLm or may sense voltages or currents of the bit lines BL1 to BLm.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a pass signal PASS or a fail signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 21:
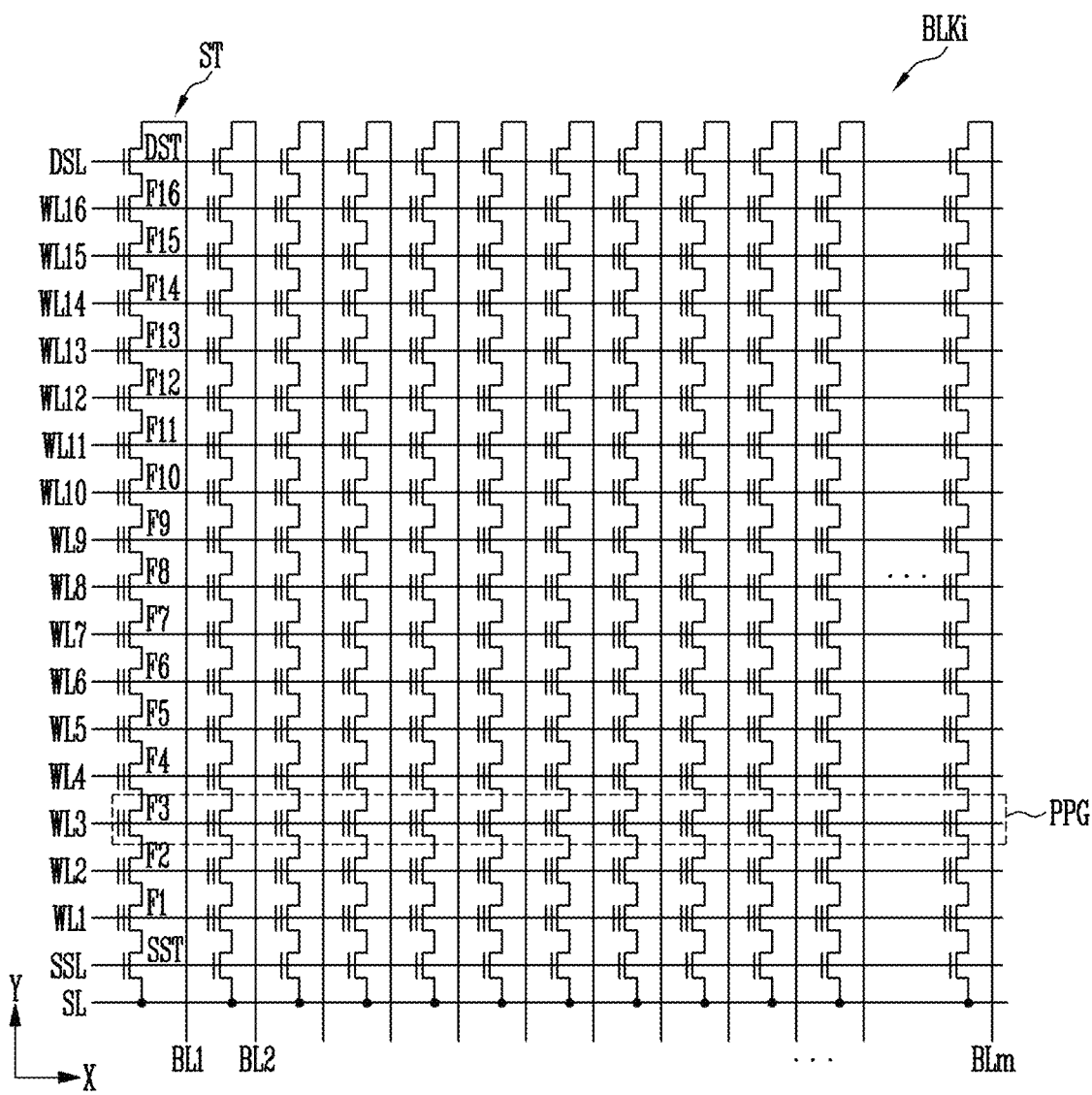
FIG. 21 is an example diagram illustrating a memory block.

FIG. 21 is an example diagram illustrating a memory block.

A memory cell array may include a plurality of memory blocks, and any one memory block BLKi of the plurality of memory blocks is illustrated in FIG. 21 for convenience of description.

A plurality of word lines arranged in parallel to each other between a first select line and a second select line may be coupled to the memory block BLKi. Here, the first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKi may include a number of physical pages PPG identical to the number of word lines WL1 to WL16.

Figure 22:
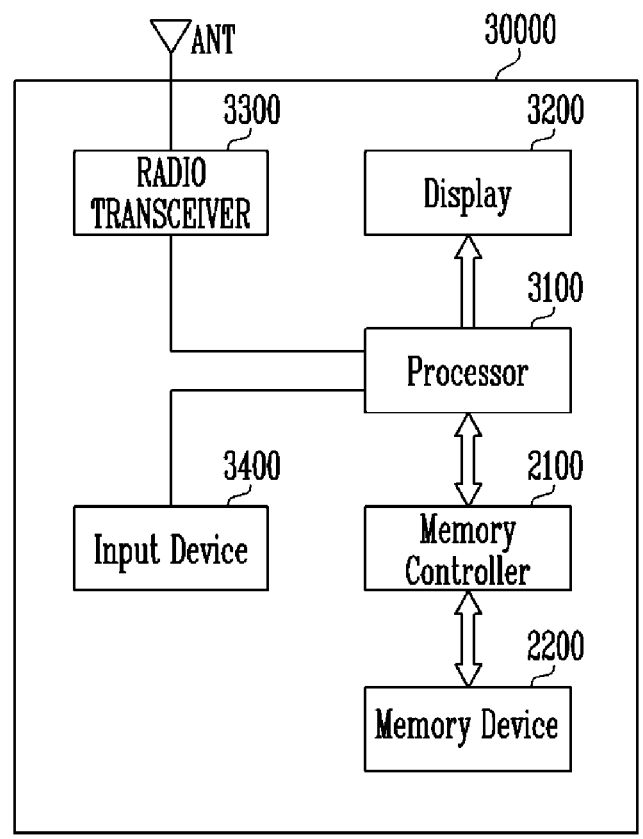
FIG. 22 is a diagram illustrating an embodiment of a memory system including a memory controller of FIG. 19.

FIG. 22 is a diagram illustrating an embodiment of a memory system including a memory controller of FIG. 19.

Referring to FIG. 22, a memory system 30000 may be implemented as a cellular phone, a smartphone, a tablet, a personal computer (PC), a personal digital assistant (PDA) or a wireless communication device. The memory system 30000 may include a memory device 2200 and a memory controller 2100 that is capable of controlling the operation of the memory device 2200.

The memory controller 2100 may control a data access operation of the memory device 2200, for example, a program operation, an erase operation or a read operation, under the control of a processor 3100.

Data programmed to the memory device 2200 may be output via a display 3200 under the control of the memory controller 2100.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300, and may transmit the processed signals to the memory controller 2100 or the display 3200. The memory controller 2100 may transmit the signals processed by the processor 3100 to the memory device 2200. Further, the radio transceiver 3300 may change signals output from the processor 3100 into radio signals, and output the changed radio signals to an external device through the antenna ANT.

An input device 3400 may be a device that is capable of inputting a control signal for controlling the operation of the processor 3100 or data to be processed by the processor 3100. The input device 3400 may be implemented as a pointing device such as a touch pad or a computer mouse, a keypad, a keyboard or an image sensor.

The processor 3100 may control the operation of the display 3200 so that data output from the memory controller 2100, data output from the radio transceiver 3300, or data output from the input device 3400 is output via the display 3200.

In accordance with an embodiment, the memory controller 2100 that is capable of controlling the operation of the memory device 2200 may be implemented as a part of the processor 3100 or as a chip provided separately from the processor 3100.

Figure 23:
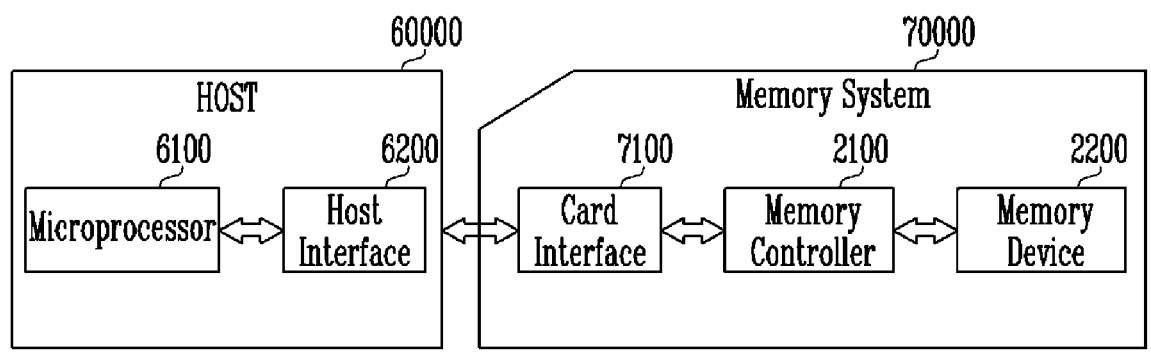
FIG. 23 is a diagram illustrating an embodiment of a memory system including the memory controller of FIG. 19.

FIG. 23 is a diagram illustrating an embodiment of a memory system including a memory controller of FIG. 19.

Referring to FIG. 23, a memory system 70000 may be implemented as a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be, but is not limited to, a secure digital (SD) card interface or a multi-media card (MMC) interface.

The card interface 7100 may interface data exchange between a host 60000 and the memory controller 2100 according to the protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000, such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor 6100.

In accordance with the disclosed technology, an error floor phenomenon can be mitigated.

While this document contains many specifics, these should not be construed as limitations on the scope of an invention that is claimed or of what may be claimed, but rather as descriptions of features specific to particular embodiments.

Only a few examples and implementations are disclosed. Variations, modifications, and enhancements to the described examples and implementations and other implementations can be made based on what is disclosed and/or illustrated.

What is claimed is:
1. An electronic device, comprising:
 a training data generator configured to generate information of a trapping set that has been detected during an error correction decoding of a codeword, to generate an input vector based on the information of the trapping set, and to generate a target vector corresponding to the input vector; and
 a training component configured to receive from the training data generator the input vector and the target vector and operable to train an artificial neural network based on supervised learning that is learned to output the target vector corresponding to the input vector to an output layer of the artificial neural network according to the input vector input to an input layer of the artificial neural network, wherein, in response to detection of the trapping set received from a node processor, the training component inputs any one of the information of the trapping set to the input layer of a trained artificial neural network and outputs the target vector corresponding to the any one of the information of the trapping set output from the output layer of the trained artificial neural network to the node processor, and wherein, when the information of the trapping set includes an error vector corresponding to the trapping set, the training data generator divides the error vector into a plurality of sections, generates a partially cyclic-shifted error vector by cyclic-shifting vectors respectively included in the plurality of sections by an identical shift amount, determines the partially cyclic-shifted error vector as the input vector, and determines a zero vector having a length corresponding to the partially cyclic-shifted error vector as the target vector.

2. The electronic device according to claim 1, wherein the training data generator is configured to determine a hard-decision vector corresponding to the trapping set as the input vector and determine a decoded codeword as the target vector.

3. The electronic device according to claim 1, wherein the training data generator is configured to determine a partial hard-decision vector including binary values corresponding to a specific degree as the input vector, and determine a partial codeword corresponding to the partial hard-decision vector in the codeword as the target vector, wherein the binary values corresponding to the specific degree are some of binary values included in a hard-decision vector corresponding to the trapping set.

4. The electronic device according to claim 1, wherein the training data generator is configured to determine an a-posteriori probability vector corresponding to the trapping set as the input vector, and determine a corrected a-posteriori probability vector as the target vector, the corrected a-posteriori probability vector generated by correcting signs of log likelihood ratio (LLR) values that are included in the a-posteriori probability vector corresponding to the trapping set to match the codeword.

5. The electronic device according to claim 4, wherein the training data generator is configured to generate the corrected a-posteriori probability vector by further correcting magnitudes of the LLR values included in the a-posteriori probability vector corresponding to the trapping set.

6. The electronic device according to claim 1, wherein the training data generator is configured to:
determine a partial a-posteriori probability vector including LLR values corresponding to a specific degree as the input vector, the LLR values being among LLR values included in an a-posteriori probability vector corresponding to the trapping set,
generate a corrected partial a-posteriori probability vector by correcting signs of LLR values included in the partial a-posteriori probability vector to match a partial codeword corresponding to the specific degree in the codeword, and
determine the corrected partial a-posteriori probability vector as the target vector.

7. The electronic device according to claim 1, wherein the training data generator is configured to determine the error vector corresponding to the trapping set as the input vector, and determine the zero vector having a length corresponding to the error vector as the target vector.

8. The electronic device according to claim 1, wherein the training data generator is configured to determine a partial error vector including binary values corresponding to a specific degree as the input vector, and determine the zero vector having the length corresponding to the partial error vector as the target vector, wherein the binary values corresponding to the specific degree are some of binary values included in the error vector corresponding to the trapping set.

9. The electronic device according to claim 8, wherein the specific degree corresponds to a degree less than or equal to a preset degree, the specific degree being among column degrees of columns included in an irregular parity check matrix.

10. The electronic device according to claim 1, wherein the plurality of sections are sections divided depending on sizes of cyclic permutation matrices included in a parity check matrix of a quasi cyclic-low density parity check (QC-LDPC) code.

11. The electronic device according to claim 1, wherein the training data generator is configured to:
divide a partial error vector into a plurality of sections, the partial error vector including binary values corresponding to a specific degree that are among binary values included in the error vector corresponding to the trapping set,
generate a partially cyclic-shifted partial error vector by cyclic-shifting vectors respectively included in the plurality of sections by an identical shift amount,
determine the partially cyclic-shifted partial error vector as the input vector, and
determine a zero vector having a length corresponding to the partially cyclic-shifted partial error vector as the target vector.

12. The electronic device according to claim 1, wherein the training data generator is configured to determine a syndrome vector corresponding to the trapping set as the input vector and determine the error vector corresponding to the trapping set as the target vector.

13. The electronic device according to claim 1, wherein the training data generator is configured to determine, as the input vector, a vector generated by adding the error vector corresponding to the trapping set to a null space, and determine the null space as the target vector.

* * * * *